(12) United States Patent
Kojima et al.

(10) Patent No.: US 9,977,337 B2
(45) Date of Patent: May 22, 2018

(54) EXPOSURE APPARATUS AND EXPOSURE METHOD

(71) Applicant: ADVANTEST CORPORATION, Tokyo (JP)

(72) Inventors: Shoji Kojima, Tokyo (JP); Akio Yamada, Gunma (JP); Masahiro Seyama, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days. days.

(21) Appl. No.: 15/221,600

(22) Filed: Jul. 28, 2016

(65) Prior Publication Data
US 2017/0090298 A1    Mar. 30, 2017

(30) Foreign Application Priority Data
Sep. 24, 2015 (JP) ................. 2015-187045

(51) Int. Cl.
*G03F 7/20* (2006.01)
*H01J 37/04* (2006.01)
*H01J 37/317* (2006.01)

(52) U.S. Cl.
CPC .......... *G03F 7/7055* (2013.01); *G03F 7/2059* (2013.01); *H01J 37/045* (2013.01); *H01J 37/3177* (2013.01); *H01J 2237/304* (2013.01)

(58) Field of Classification Search
CPC .... G03F 7/7055; G03F 7/2059; H01J 37/045; H01J 37/3174; H01J 37/3177
USPC ......... 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 5,910,658 A * | 6/1999 | Arai | B82Y 10/00 250/398 |
| 6,015,975 A | 1/2000 | Kawakami et al. | |
| 7,276,714 B2 | 10/2007 | Platzgummer et al. | |
| 8,492,732 B2 | 7/2013 | Ogasawara | |
| 8,658,985 B2 | 2/2014 | Hirata | |
| 2003/0029998 A1 | 2/2003 | Matsumoto et al. | |
| 2005/0133734 A1 | 6/2005 | Moriya | |
| 2007/0057204 A1 | 3/2007 | Kruit et al. | |
| 2009/0218509 A1 | 9/2009 | Ito et al. | |
| 2012/0187307 A1 | 7/2012 | Inoue | |
| 2013/0016327 A1 | 1/2013 | Looije et al. | |

(Continued)

OTHER PUBLICATIONS

Office Action issued for counterpart Korean Application 10-2016-0095783, issued by the Korean Intellectual Property Office dated Jun. 5, 2017.

(Continued)

*Primary Examiner* — Nicole Ippolito

(57) ABSTRACT

Provided is an exposure apparatus that exposes a pattern on a sample, the exposure apparatus including a plurality of blanking electrodes that are provided corresponding to a plurality of charged particle beams and each switch whether the corresponding particle beam irradiates the sample according to an input voltage; an irradiation control section that outputs switching signals for switching blanking voltages supplied respectively to the blanking electrodes; and a measuring section that, for each blanking electrode, measures a delay amount that is from when the switching signal changes to when the blanking voltage changes.

9 Claims, 20 Drawing Sheets

(56) References Cited

U.S. PATENT DOCUMENTS

| | | |
|---|---|---|
| 2013/0196517 A1 | 8/2013 | Tsujita et al. |
| 2013/0253688 A1 | 9/2013 | Matsumoto |
| 2015/0144801 A1 | 5/2015 | Biberger et al. |

OTHER PUBLICATIONS

Extended European Search Report for European Patent Application No. 16181810.9, issued by the European Patent Office dated Oct. 7, 2016.

Notice of First Office Action for Patent Application No. 201610609096.0, issued by the State Intellectual Property Office of the People's Republic of China dated Sep. 21, 2017.

Office Action issued for counterpart Taiwanese Application 105123376, issued by the Taiwan Intellectual Property Office dated Nov. 23, 2017.

Office Action issued for counterpart Korean Application 10-2016-0095783, issued by the Korean Intellectual Property Office dated Jan. 18, 2018.

* cited by examiner

EXPOSURE APPARATUS AND EXPOSURE METHOD

The contents of the following Japanese patent application are incorporated herein by reference:
No. 2015-187045 filed on Sep. 24, 2015.

BACKGROUND

1. Technical Field

The present invention relates to an exposure apparatus and an exposure method.

2. Related Art

Conventionally, complementary lithography is known for forming a fine wire pattern by performing machining of a simple line pattern formed by optical exposure technology with a line width of tens of nanometers, using a charged particle beam such as an electron beam, as shown in Patent Documents 1 and 2, for example. Furthermore, a multi-beam exposure technique is known using a plurality of charged particle beams, as shown in Patent Documents 3 and 4, for example.

Patent Document 1: Japanese Patent Application Publication No. 2013-16744
Patent Document 2: Japanese Patent Application Publication No. 2013-157547
Patent Document 3: U.S. Pat. No. 7,276,714
Patent Document 4: Japanese Patent Application Publication No. 2013-93566

In the conventional technology, in a case where multi-beam exposure technology is used to expose a pattern by independently switching a plurality of charged particle beams between an ON state and an OFF state, it is difficult to measure and adjust the timing at which each of the charged particle beams irradiates a sample. Actually, however, implementation errors occur in the dimensional accuracy, arrangement accuracy, and the like of the wires and blanking electrodes for switching whether the charged particle beams are radiated, depending on variation or the like in the manufacturing process. In accordance with the development of finer wire patterns, the effects of such implementation errors become more obvious and the variations among the radiation timings of the beams cause errors in the exposure position and exposure amount.

SUMMARY

Therefore, it is an object of an aspect of the innovations herein to provide an exposure apparatus and an exposure method, which are capable of overcoming the above drawbacks accompanying the related art. The above and other objects can be achieved by combinations described in the claims. According to a first aspect of the present invention, provided is an exposure apparatus that exposes a pattern on a sample, the exposure apparatus comprising a plurality of blanking electrodes that are provided corresponding to a plurality of charged particle beams and each switch whether the corresponding particle beam irradiates the sample according to an input voltage; an irradiation control section that outputs switching signals for switching blanking voltages supplied respectively to the blanking electrodes; and a measuring section that, for each blanking electrode, measures a delay amount that is from when the switching signal changes to when the blanking voltage changes.

The measuring section may include a reference voltage generating section that generates a reference voltage; and a delay amount detecting section that, for each blanking electrode, detects the delay amount that is from when the switching signal changes to when the blanking voltage reaches the reference voltage.

The reference voltage generating section may sequentially change and generate the reference voltage, and the delay amount detecting section may, for each blanking electrode, detect the delay amount that is from when the switching signal changes to when the blanking voltage reaches the reference voltage, in response to the reference voltage being changed.

The irradiation control section may include a timing adjusting section that individually adjusts an output timing of the switch signal for each blanking electrode.

The timing adjusting section may, for each blanking electrode, individually adjust the output timing of the switch signal such that the blanking voltage reaches a predetermined threshold voltage at a predetermined timing.

The exposure apparatus may comprise a plurality of drive circuits that are provided corresponding to the blanking electrodes and each output a blanking voltage corresponding to the switching signal to the corresponding blanking electrode.

Each drive circuit may include a time adjusting section that individually adjusts a transient time of the blanking voltage output by the corresponding drive circuit.

According to a second aspect of the present invention, provided is a method using an exposure apparatus that exposes a pattern on a sample, the method comprising irradiation control of outputting switching signals for switching blanking voltages supplied respectively to a plurality of blanking electrodes that are provided corresponding to a plurality of charged particle beams and each switch whether the corresponding particle beam irradiates the sample according to an input voltage; and measurement of, for each blanking electrode, measuring a delay amount that is from when the switching signal changes to when the blanking voltage changes.

The measurement may include reference voltage generation of generating a reference voltage, and detection of, for each blanking electrode, detecting the delay amount that is from when the switching signal changes to when the blanking voltage reaches the reference voltage.

The reference voltage generation may include sequentially changing and generating the reference voltage, and the detection may include, for each blanking electrode, detecting the delay amount that is from when the switching signal changes to when the blanking voltage reaches the reference voltage, in response to the reference voltage being changed.

The method may further comprise adjustment of, for each blanking electrode, adjusting the time needed for the blanking voltage to reach a predetermined threshold voltage.

The adjustment may include, for each blanking electrode, individually adjusting an output timing of the switch signal.

The exposure apparatus may comprise a plurality of drive circuits that are provided corresponding to the blanking electrodes and each output a blanking voltage corresponding to the switching signal to the corresponding blanking electrode, and the adjustment may include time adjustment of, for each blanking electrode, individually adjusting a transient time of the blanking voltage output by the corresponding drive circuit.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
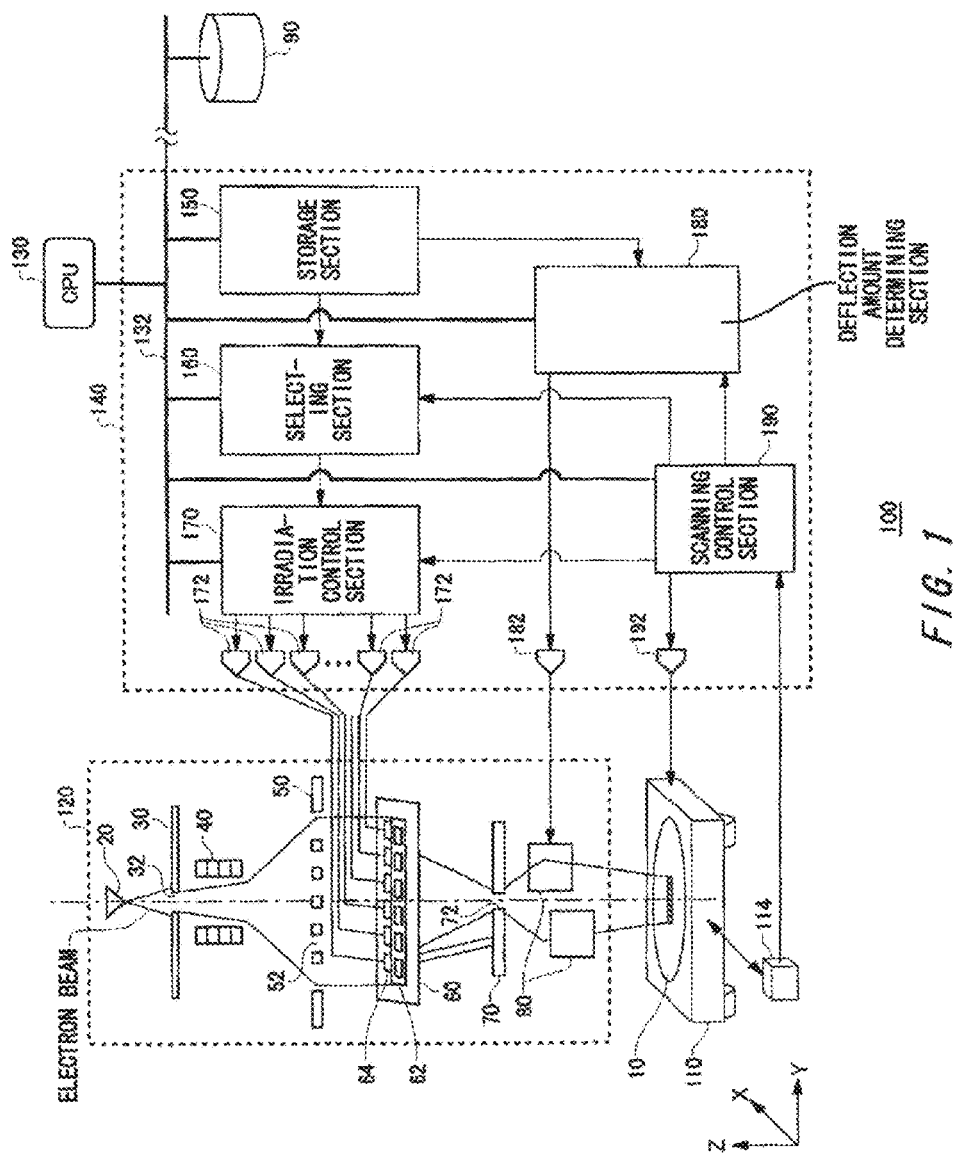
FIG. 1 shows a first exemplary configuration of an exposure apparatus 100 according to an embodiment of the present invention.

FIG. 1 shows an exemplary configuration of an exposure apparatus 100 according to an embodiment of the present invention. The exposure apparatus 100 radiates a charged particle beam having an irradiation region corresponding to a predetermined grid at a position corresponding to a line pattern on a sample formed with different line widths and different pitches based on the grid, thereby exposing the line pattern. The exposure apparatus 100 includes a stage section 110, a detecting section 114, a column section 120, a CPU 130, and an exposure control section 140.

The stage section 110 has the sample 10 mounted thereon and moves the sample 10. The sample 10 may be a substrate formed of a semiconductor, glass, and/or ceramic, for example, and may be a semiconductor wafer formed of silicon, for example. The sample 10 is a substrate having a line pattern made of a conductive body such as metal formed on the front surface thereof. The exposure apparatus 100 of the present embodiment exposes a resist formed on the line pattern in order to cleave and finely machine (e.g. form electrodes, wires, and/or vias in) the line pattern.

The stage section 110 has the sample 10 mounted thereon and moves the sample 10 in the XY plane shown in FIG. 1. The stage section 110 may be an XY stage, and may be a combination including one or more of a Z stage, a rotating stage, and a tilting stage in addition to the XY stage.

The stage section 110 moves in a predetermined direction, which is the longitudinal direction of the line pattern formed on the sample 10. The stage section 110 has the sample 10 mounted thereon such that the longitudinal direction of the line pattern is substantially parallel to the movement direction of the stage, which is the X direction or the Y direction, for example. The present embodiment describes an example in which the stage section 110 is an XY stage that moves in both the X direction and the Y direction, and the sample 10 is mounted such that the longitudinal direction of the line pattern is substantially parallel to the X direction, as shown in FIG. 1.

The detecting section 114 detects the position of the stage section 110. The detecting section 114 detects the position of the stage by irradiating the moving stage with laser light and detecting the reflected light, for example. The detecting section 114 preferably detects the position of the stage with an accuracy of approximately 1 nm or better.

The column section 120 irradiates the sample 10 mounted on the stage section 110 with a charged particle beam having electrons and ions. The present embodiment describes an example in which the column section 120 radiates an electron beam. The column section 120 of the present embodiment is a beam generating section that generates a plurality of charged particle beams having different irradiation positions in the width direction of the line pattern formed on the sample 10. The column section 120 includes an electron gun 20, an aperture plate 30, a beam deforming section 40, an aperture array 50, a blanking section 60, a stopping plate 70, and a deflecting section 80.

The electron gun 20 emits electrons using an electric field or heat, and applies a predetermined electric field to the emitted electrons to accelerate the electrons in the direction of the sample 10, which is the −Z direction in FIG. 1, thereby outputting the electron beam. The electron gun 20 may apply a predetermined acceleration voltage, e.g. 50 keV, to output the electron beam. The electron gun 20 may be provided along a vertical line that is parallel to the Z axis from the front surface of the sample 10, which is parallel to the XY plane.

The aperture plate 30 is provided between the electron gun 20 and the sample 10, and blocks a portion of the electron beam emitted by the electron gun 20. The aperture plate 30 has a circular aperture 32, for example, and blocks a portion of the electron beam with the aperture 32 while allowing the remaining portion of the electron beam to pass. The center of the aperture 32 may be formed in a manner to intersect the vertical line connecting the electron gun 20 and the sample 10. In other words, the aperture plate 30 passes an electron beam within a predetermined emission angle range, from within the electron beam emitted from the electron gun 20.

The beam deforming section 40 is provided between the aperture plate 30 and the sample 10, and deforms the substantially circular cross-sectional shape of the electron beam passed through the aperture plate 30. The beam deforming section 40 may be an electron lens such as an electrostatic quadrupole electrode, for example, and deforms the cross-sectional shape of the electron beam in a manner to become an elliptical shape or the like that extends in one direction. In the example of FIG. 1, the beam deforming section 40 deforms the cross-sectional shape of the electron beam in a manner to have a cross-sectional shape that extends in a direction parallel to the Y axis.

The aperture array 50 is provided between the beam deforming section 40 and the sample 10, and blocks a portion of the electron beam having the cross-sectional shape deformed by the beam deforming section 40. The aperture array 50 has a plurality of apertures 52 lined up in one direction, and blocks a portion of the electron beam with these apertures 52 while passing the rest of the electron beam.

In the example of FIG. 1, the apertures 52 are lined up with predetermined intervals therebetween in the direction parallel to the Y axis, and are cut out in a manner to form a plurality of electron beams from the electron beam having a cross-sectional shape that extends in the direction parallel to the Y axis. The aperture array 50 receives the electron beam input thereto and outputs a resulting electron beam group (referred to as an "array beam" in the present embodiment) in an array corresponding to the apertures 52.

The blanking section 60 is provided between the aperture array 50 and the sample 10, and switches whether each of the plurality of charged particle beams output by the aperture array 50 irradiates the sample 10. Specifically, the blanking section 60 switches whether each beam in the array beam is deflected to have an orientation differing from the direction toward the sample 10. The blanking section 60 includes a plurality of apertures 62 that correspond respectively to the beams in the array beam and are lined up in one direction, and a plurality of blanking electrodes 64 that correspond respectively to the beams in the array beam and apply an electric field within the apertures 62.

In the example of FIG. 1, the apertures 62 are lined up at predetermined intervals in the direction parallel to the Y axis, and each beam of the array beam is passed therethrough independently. For example, when voltage is not supplied to a blanking electrode 64, no electric field is applied to the electron beam in the corresponding aperture 62, and therefore the electron beam incident to this aperture 62 is passed in the direction toward the sample 10 without being deflected (this is referred to as a "beam ON" state). Furthermore, when voltage is supplied to a blanking electrode 64, an electric field is generated in the corresponding aperture 62, and therefore the electron beam incident to this aperture 62 is deflected in a direction differing from the direction in which the electron beam travels toward the sample 10 (this is referred to as a "beam OFF" state).

The stopping plate 70 is provided between the blanking section 60 and the sample 10, and blocks the electron beams deflected by the blanking section 60. The stopping plate 70 includes an aperture 72. The aperture 72 may have a substantially elliptical shape or rectangular shape that is extended in one direction, and the center of the aperture 72 may be formed to intersect the straight line connecting the electron gun 20 and the sample 10. In the example of FIG. 1, the aperture 72 has a shape that extends in the direction parallel to the Y axis.

The aperture 72 passes the electron beams that have been passed without being deflected by the blanking section 60, and prevents the progression of electron beams that have been deflected by the blanking section 60. Specifically, the column section 120 combines the blanking section 60 and the stopping plate 70 and controls the voltage supplied to the blanking electrodes 64, thereby enabling the column section 120 to switch (blanking operation) whether each electron beam included in the array beams irradiates the sample 10 (the beam ON state) or does not irradiate the sample 10 (the beam OFF state).

The deflecting section 80 is provided between the stopping plate 70 and the sample 10, deflects the plurality of charged particle beams, and adjusts the irradiation position of the array beam irradiating the sample 10. The deflecting section 80 may include a deflector that deflects an electron beam by applying an electric field corresponding to a drive signal input thereto to the electron beam passing therethrough, and may adjust the irradiation position of the array beam by deflecting the array beam. The deflecting section 80 may include one or more electromagnetic coils, and adjust the irradiation position of the array beam by applying a magnetic field to the array beam.

The column section 120 according to the present embodiment described above generates a plurality of electron beams oriented in a predetermined direction, and switches whether each electron beam irradiates the sample 10. In the column section 120, the orientation direction of each of the plurality of electron beams is determined by the direction in which the beam deforming section 40 deforms the cross-sectional shape of the beam, the arrangement direction of the apertures 52 of the aperture array 50, the arrangement direction of the apertures 62 of the blanking section 60 and of the corresponding blanking electrodes 64, and the like.

When these directions substantially match the width direction of the line pattern, which is orthogonal to the movement direction of the stage section 110, the column section 120 mounts the sample 10 such that the movement direction of the stage section 110 substantially matches the longitudinal direction of the line pattern on the sample 10, and therefore the plurality of electron beams are generated with different irradiation positions in the width direction of the line pattern. The present embodiment describes an example in which the column section 120 radiates the array beam oriented in the Y direction, which is a direction perpendicular to the line pattern that is substantially parallel to the X direction.

The CPU 130 controls the overall operation of the exposure apparatus 100. The CPU 130 may have a function of an input terminal that inputs manipulation instructions from a user. The CPU 130 may be a computer, a work station, or the like. The CPU 130 is connected to the exposure control section 140, and controls the exposure operation of the exposure apparatus 100 according to input from the user. For example, the CPU 130 is connected to each component of the exposure control section 140 via a bus 132, and send and receives control signals and the like.

The exposure control section 140 is connected to the stage section 110 and the column section 120, and controls the stage section 110 and the column section 120 to perform the exposure operation on the sample 10, according to the control signals and the like received from the CPU 130. Furthermore, the exposure control section 140 may be connected to the external storage section 90 via the bus 132, and send and receive data of patterns stored in the external storage section 90, for example. Instead, the external storage section 90 may be connected directly to the CPU 130. Instead, the exposure control section 140 may include a storage section that stores pattern data or the like therein. The exposure control section 140 includes the storage section 150, a selecting section 160, an irradiation control section 170, a deflection amount determining section 180, and a scanning control section 190.

The storage section 150 stores a cut pattern, which is a pattern for the exposure by the exposure apparatus 100, in order to cut the line pattern formed on the sample 10 and a via pattern, which is a pattern for the exposure by the exposure apparatus 100, in order to form vias in the sample 10. The storage section 150 receives the information concerning the cut pattern and the via pattern from the external storage section 90 and stores this information, for example. The storage section 150 may receive the information concerning the cut pattern and the via pattern input from the user via the CPU 130 and store this information.

The storage section 150 stores configuration information of the sample 10 and configuration information of the line pattern formed on the sample 10. The storage section 150 may store measurement results obtained by performing a measurement in advance as the configuration information, before beginning the exposure operation. For example, the storage section 150 stores, as the configuration information of the sample 10, information concerning sources of positioning error such as contraction (deformation error caused by the manufacturing process), rotational error (caused by transport or the like), warping of the substrate or the like, and height distribution of the sample 10.

Furthermore, the storage section 150 stores, as the configuration information of the line pattern, information relating to misalignment between the irradiation position of the array beam and the position of the line pattern. The storage section 150 preferably sets the configuration information to be the configuration information of the sample 10 and the configuration information of the line pattern obtained by measuring the sample 10 mounted on the stage section 110. Instead, the storage section 150 may store a past measurement result of the sample 10 or a measurement result of another sample in the same batch, for example.

The selecting section 160 is connected to the storage section 150, reads the information of the cut pattern and the via pattern, and identifies the designation of the irradiation positions in the longitudinal direction on the line pattern. The selecting section 160 selects at least one charged particle beam to irradiate the sample 10, from among the plurality of charged particle beams generated by the column section 120, at the designated irradiation positions in the longitudinal direction on the line pattern. The selecting section 160 selects the electron beams to be radiated from within the array beam based on the information of the cut pattern and the via pattern, and provides the irradiation control section 170 with the selection result.

The irradiation control section 170 is connected to the selecting section 160 and receives the selection result of the selecting section 160. The irradiation control section 170, for the at least one charged particle beam selected by the selecting section 160, generates a signal for switching between the ON state and the OFF state and sets this signal in the drive circuit 172. The drive circuit 172 receives the switching signal from the irradiation control section 170 and supplies the blanking electrode 64 of the blanking section 60 with a deflection voltage (blanking voltage) for blanking the beam. The relationship between the switching of the ON/OFF state of an electron beam by the irradiation control section 170 and the blanking voltage output to the blanking electrode 64 by the drive circuit 172 is described later using the drawings.

The deflection amount determining section 180 is connected to the storage section 150, reads the configuration information of the sample 10 and the configuration information of the line pattern, calculates the adjustment value by which the irradiation position of the array beam is to be adjusted according to the information concerning the position error of the sample 10 and the irradiation position error of the array beam, and determines a deflection amount corresponding to this adjustment value. The deflection amount determining section 180 is connected to the column section 120 and adjusts the irradiation position of the array beam based on the determined deflection amount. The deflection amount determining section 180 supplies the deflecting section 80 with a control signal for deflecting the array beam according to the determined deflection amount, via the deflecting section drive circuit 182. Here, the deflecting section drive circuit 182 converts the control signal corresponding to the deflection amount output from the deflection amount determining section 180 into a drive signal that is input to the deflecting section 80.

The scanning control section 190 is connected to the stage section 110 and scans the irradiation positions of the plurality of charged particle beams along the longitudinal direction of the line pattern. The scanning control section 190 according to the present embodiment performs scanning with the array beam along the longitudinal direction of the line pattern by moving the stage section 110 with the sample 10 mounted thereon in a direction substantially parallel to the X direction. The scanning control section 190 supplies a control signal for moving the stage section 110, via the stage drive circuit 192. The stage drive circuit 192 converts the control signal corresponding to the movement amount and the movement direction output from the scanning control section 190 into a corresponding drive signal for the stage section 110.

The scanning control section 190 is connected to the detecting section 114 and receives a detection result of the stage position of the stage section 110. The scanning control section 190 may acquire the movement amount by which the stage section 110 actually moved and the position error of the stage, i.e. the movement error, based on the detection result, and provide feedback for the movement control of the stage section 110. Furthermore, the scanning control section 190 may be connected to the deflection amount determining section 180 and adjust the paths traveled by the charged particle beams according to the movement error of the sample 10 caused by the stage section 110.

The scanning control section 190 is connected to the selecting section 160 and the irradiation control section 170, and supplies the selecting section 160 and the irradiation control section 170 with the position information of the stage section 110. The irradiation control section 170 acquires the timing at which the line pattern of the sample 10 is irradiated by the array beam, based on the position information of the stage section 110.

The scanning control section 190 moves the irradiation position of the array beam in the width direction of the line pattern as well, and performs scanning such that a predetermined region on the front surface of the sample 10 becomes the possible irradiation region of the array beam. The following describes an example of the scanning control section 190 performing scanning with the array beam, using FIG. 2.

Figure 2:
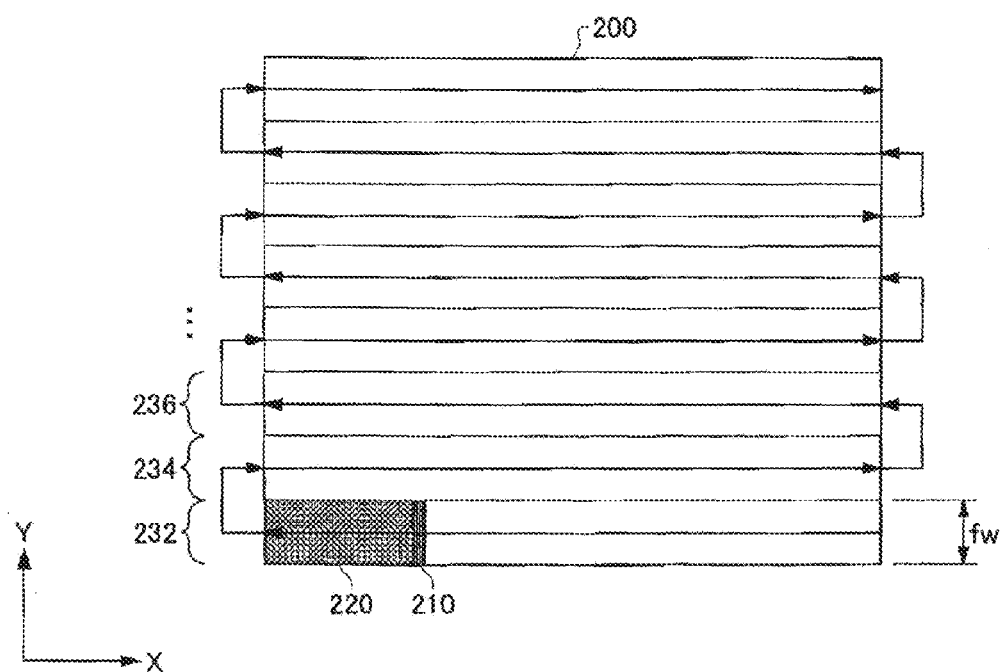
FIG. 2 shows an example of a possible irradiation region 200 formed in a portion of the front surface of the sample 10 by the exposure apparatus 100 according to the present embodiment scanning with the array beam.

An example of a possible irradiation region 200 formed in a portion of the front surface of the sample 10 by the exposure apparatus 100 according to the present embodiment scanning with the array beam is shown. FIG. 2 shows the front surface of the sample 10 substantially parallel to the XY plane, and fw indicates the beam width of the total of the plurality of electron beams lined up in the Y direction of the array beam radiated by the exposure apparatus 100, i.e. the width direction of the line pattern. Here, the beam width fw is substantially 30 μm, for example.

The scanning control section 190 moves the sample 10 in the longitudinal direction of the line pattern using the stage section 110, in a state where the paths traveled by the charged particle beams are maintained. FIG. 2 shows an example in which the scanning control section 190 moves the stage section 110 in the −X direction. In this way, the front surface of the sample 10 is scanned at the irradiation position 210 of the array beam in the +X direction, and the array beam sets a band-shaped region 220 as the possible irradiation region of the electron beams. Specifically, the scanning control section 190 moves the stage section 110 a predetermined distance in the X direction to set a first frame 232 as the possible irradiation region. Here, the first frame 232 has a surface area of 30 mm by 30 μm, for example.

Next, the scanning control section 190 moves the stage section 110 in the −Y direction by the beam width fw of the array beam, and then moves the stage section 110 back in the +X direction by an amount equal to the predetermined distance that the stage section 110 was previously moved in the −X direction. As a result, a portion of the front surface of the sample 10 differing from the first frame 232 is scanned at the irradiation position 210 of the array beam in the −X direction, and a second frame 234 adjacent to the first frame 232 in the +Y direction and having substantially the same surface area as the first frame 232 is set as the possible irradiation region. In the same manner, the scanning control section 190 moves the stage section 110 in the −Y direction by the beam width fw of the array beam, and then moves the stage section 110 in the −X direction by the predetermined distance and sets a third frame 236 as the possible irradiation region.

In this way, the scanning control section 190 moves the stage section 110 back and forth in the X direction, which is the longitudinal direction of the line pattern, and sets a predetermined region on the front surface of the sample 10 to be the possible irradiation region 200 of the array beam. Here, the scanning control section 190 sets a 30×30 mm square region to be the possible irradiation region 200, for example.

The present embodiment describes an example in which the scanning control section 190 sets a square region to be the possible irradiation region 200 of the array beam by moving the stage section 110 back and forth, but the present invention is not limited to this, and the scanning control section 190 may perform scanning by deflecting the radiation direction of the array beam. In this case, the scanning control section 190 may supply a deflection amount corresponding to the distance to be scanned to the deflection amount determining section 180 and perform scanning with the array beam. Furthermore, the present embodiment describes an example in which the scanning control section 190 sets the possible irradiation region 200 of the array beam to have a rectangular shape, but the present invention is not limited to this, and a predetermined region formed by the scanning with the array beam may be set as the possible irradiation region 200 of the array beam.

The exposure apparatus 100 according to the present embodiment described above exposes the sample 10 by radiating the array beam corresponding to the irradiation position on the line pattern while moving the stage section 110 back and forth in the X direction, which is the longitudinal direction of the line pattern. In other words, the exposure apparatus 100 irradiates and exposes the line pattern within the possible irradiation region 200 of the array beam with charged particle beams at an exposure position corresponding to the cut pattern and the via pattern to be formed. The exposure operation of the exposure apparatus 100 is described below using FIG. 3.

Figure 3:
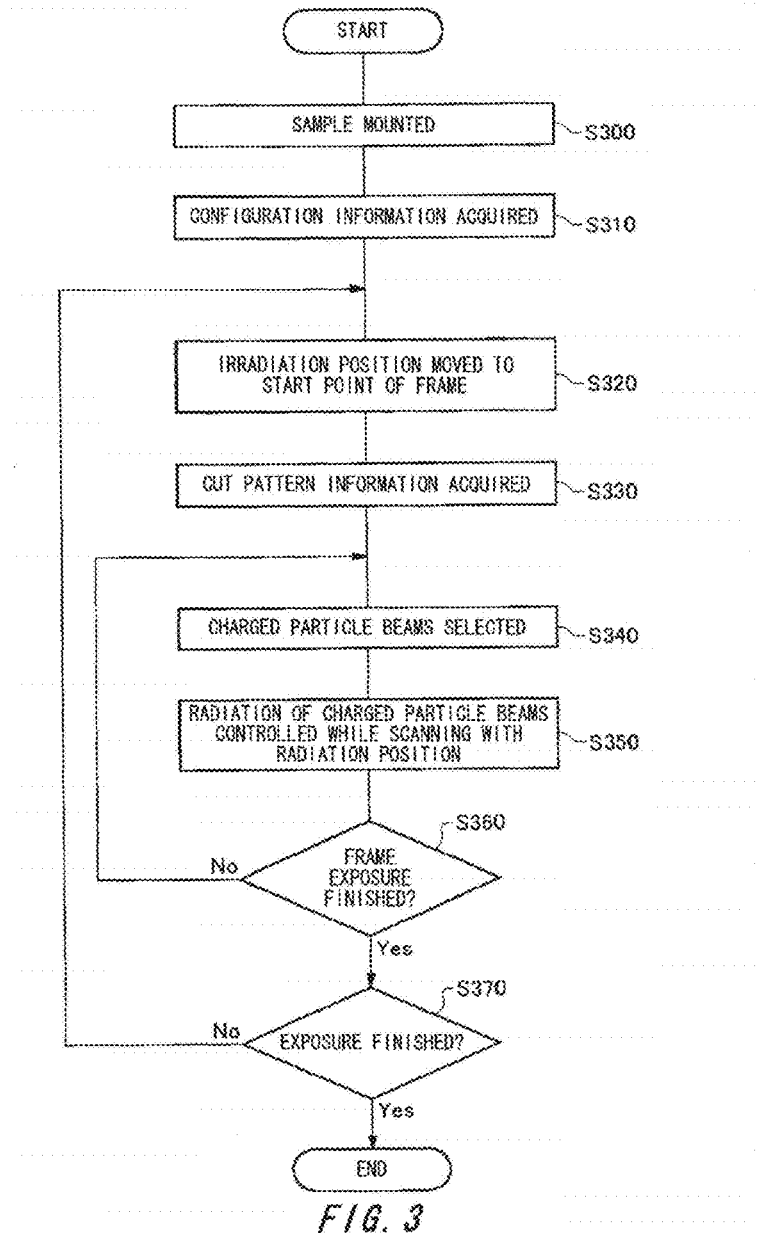
FIG. 3 shows an operational flow of the exposure apparatus 100 according to the present embodiment.

FIG. 3 shows an operational flow of the exposure apparatus 100 according to the present embodiment. The present embodiment describes an example in which the exposure apparatus 100 exposes a cut pattern on the line pattern on the front surface of the sample 10, by performing the processes from S300 to S370.

First, the sample 10 that has the line pattern formed thereon and a resist applied thereto is mounted on the stage section 110 (S300). Next, the exposure apparatus 100 acquires the configuration information of the mounted sample 10 and the configuration information of the line pattern (S310). The exposure apparatus 100 stores the acquired configuration information in the storage section 150.

The exposure apparatus 100 acquires the configuration information of the sample 10 and/or the configuration information and the like of the line pattern by observing a plurality of positioning markers or the like provided on the sample 10, for example. In this case, the exposure apparatus 100 may acquire the configuration information of the line pattern by irradiating the positioning markers with the electron beams and detecting the irradiation position of the electron beams and the positions of the positioning markers from a front surface image of the sample 10 obtained by detecting secondary electrons or reflected electrons, for example.

The exposure apparatus 100 may acquire the configuration information of the sample 10 by irradiating the positioning markers with laser light, for example, and detecting the reflected light, scattered light, or the like. When the exposure apparatus 100 acquires the configuration information of the sample 10 and the configuration information of the line pattern through measurement in this way, the exposure apparatus 100 may further include an electron detecting section for detecting secondary electrons or reflected electrons, a laser light radiating apparatus, and a light detecting section, for example.

Next, the scanning control section 190 moves the stage section 110 to a position corresponding to a start point of a frame to be exposed, such that the irradiation position of the array beam is positioned at this start point (S320). When the scanning control section 190 moves the stage section 110 in the +X direction, i.e. moves the irradiation position of the array beam in the −X direction, and exposes the frame, the edge of this frame on the +X direction side is set as the start point of the frame. In this way, the stage section 110 has the sample 10 mounted thereon and moves the sample 10 relative to the beam generating section.

When the scanning control section 190 moves the stage section 110 in the −X direction, i.e. moves the irradiation position of the array beam in the +X direction, and exposes the frame, the edge of this frame on the −X direction side is set as the start point of the frame. When the scanning control section 190 moves the stage section 110 back and forth for each frame in the X direction, which is the longitudinal direction of the line pattern, according to the back and forth movement, the scanning control section 190 switches between using the edge in the −X direction and using the edge in the +X direction as the start point of the frame in an alternating manner.

At the beginning stage of the exposure operation, the scanning control section 190 may set the start point of the frame to be a predetermined position. For example, the scanning control section 190 sets the edge on the −X direction side of the frame positioned farthest on the −Y direction side to be the start point of the frame.

Figure 4:
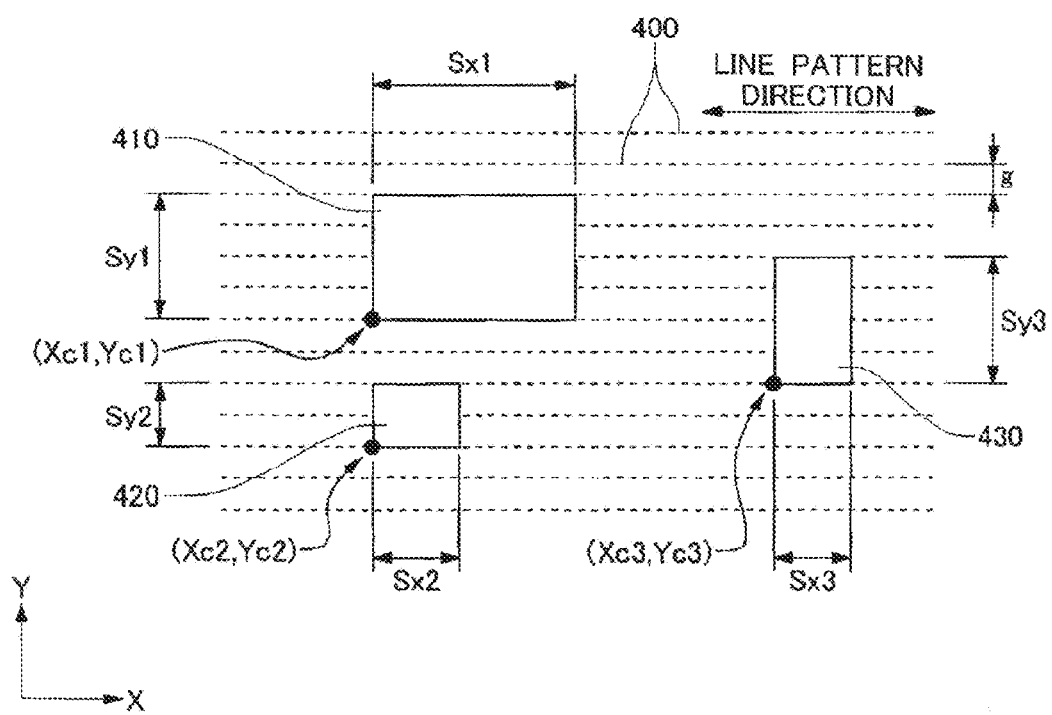
FIG. 4 shows an example of the information of the cut pattern to be formed on the sample 10.

Next, the selecting section 160 acquires from the storage section 150 the information of the cut pattern within the frame to be exposed (S330). FIG. 4 shows an example of the information of the cut pattern to be formed on the sample 10. The information of the cut pattern may include data concerning the position and the size of the cut pattern displayed as a rectangle. FIG. 4 shows an example in which the cut pattern data is the length of two sides of the cut pattern and the coordinates of predetermined portions (each vertex on the −X direction side and −Y direction side, which are the vertices in the lower left portions in the drawing).

More specifically, the {(position), size} of the cut pattern data of a first pattern 410 is shown as {(Xc1, Yc1), Sx1, Sy1}. Similarly, the {(position), size} of the cut pattern data of a second pattern 420 is shown as {(Xc2, Yc2), Sx2, Sy2} and the {(position), size} of the cut pattern data of a third pattern 430 is shown as {(Xc3, Yc3), Sx3, Sy3}.

The X direction in FIG. 4 substantially matches the longitudinal direction of the line pattern, which is the target on which the cut pattern is being superimposed. In FIG. 4, the dotted lines parallel to the X direction and arranged at intervals of g in the Y direction are a grid 400 used for designing the line pattern and the cut pattern. For example, the interval g is the grid width, and this grid width g is substantially equal to the minimum value of the line width in the short direction of the line pattern, i.e. the Y direction. Furthermore, when the line pattern has a plurality of different line widths, the line widths are all values that are n times the grid width g, where n is a natural number greater than or equal to 1. Furthermore, the pattern interval in the Y direction between adjacent line patterns is a value that is m times the grid width g, where m is a natural number greater than or equal to 1.

In the same manner, the length of the cut pattern in the Y direction and the pattern interval in the Y direction are each values that are natural number (greater than or equal to 1) multiples of the grid width g. For example, the length of the first pattern 410 in the Y direction is substantially equal to 4 g, the length of the second pattern 420 in the Y direction is substantially equal to 2 g, and the pattern interval in the Y direction between the first pattern 410 and the second pattern 420 is substantially equal to 2 g. Furthermore, in the example of FIG. 4, the Y coordinates of the cut pattern are designed to be substantially equal on the grid 400. In this way, the cut pattern and the line pattern according to the present embodiment have Y coordinates that are designed using the coordinate values of the grid 400 as a reference.

Figure 5:
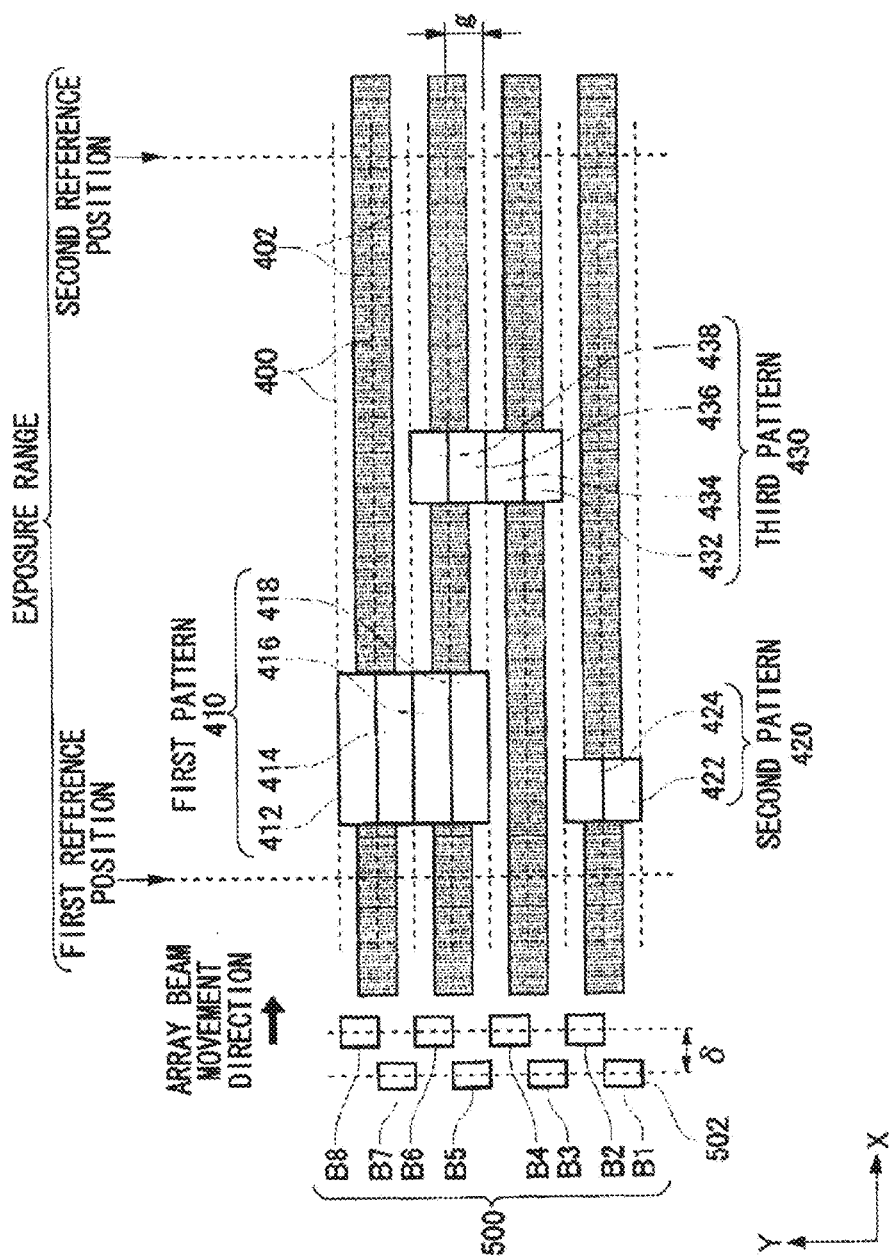
FIG. 5 shows an example in which the scanning control section 190 according to the present embodiment moves the irradiation position of the array beam to the start point of a frame.

FIG. 5 shows an example in which the scanning control section 190 according to the present embodiment moves the irradiation position of the array beam to the start point of a frame, i.e. the edge of the frame on the −X direction side. Specifically, FIG. 5 is a view of the XY plane showing an example of the positional relationship between the line pattern 402 formed on the front surface of the sample and the irradiation position of the array beam 500. Furthermore, FIG. 5 is a view of the XY plane showing an example of the positional relationship between the line pattern 402 and the cut pattern shown in FIG. 4.

The example of FIG. 5 shows a case in which one frame includes four line patterns 402, and the line width of each line pattern 402 and the intervals between adjacent line patterns 402 are both substantially equal to the grid width g of the grid 400. In the drawing, the first pattern 410 is a pattern in which two line patterns 402 from the uppermost portion are cut simultaneously, the second pattern 420 is a pattern in which a line pattern 402 of the bottommost portion is cut, and the third pattern 430 is a pattern in which two line patterns 402 in the center are cut simultaneously.

FIG. 5 shows an example in which the array beam 500 includes a total of eight electron beams B1 to B8. The array beam 500 irradiates each of a plurality of irradiation regions 502 on the sample 10 with an electron beam. The beam width in the width direction of the line patterns, i.e. the Y direction, of each of the electron beams B1 to B8 is substantially equivalent to the grid width g. Furthermore, the irradiation positions of the electron beams B1 to B8 on the sample 10 are arranged at intervals of the grid width g in the Y direction, resulting in a total width of substantially 8 g, such that a range with a width of substantially 8 g in the frame is exposed. In other words, the array beam 500 has a beam width in the Y direction that is a value equal to the product of the number of electron beams in the array beam 500 and the grid width g, and a frame having a width in the Y direction substantially equal to this beam width is exposed.

Here, when the irradiation positions of the plurality of electron beams can be arranged in one column with intervals of the grid width g therebetween, the column section 120 may irradiate the sample 10 with the array beams 500 lined up in this column. Instead, the column section 120 may irradiate the sample 10 with array beams 500 for which the irradiation positions of the electron beams are arranged in a plurality of columns.

FIG. 5 shows an example in which the array beam 500 includes electron beams that are lined up in two columns with an interval 6 therebetween in the longitudinal direction of the line pattern. The irradiation positions of the electron beams included in each column are arranged with distances substantially equal to the grid width g therebetween in the width direction of the line pattern. Accordingly, the column including the odd-numbered electron beams B1, B3, B5, and B7, which is referred to as the "first column," has a total width in the Y direction of substantially 7 g. Similarly, the column including the even-numbered electron beams, which is referred to as the "second column," also has a total width in the Y direction of substantially 7 g.

At step S320 when the scanning control section 190 moves the irradiation position of the array beam 500 to the start point of the frame, the irradiation positions of the electron beams are arranged respectively between the corresponding grid lines. FIG. 5 shows an example in which the irradiation position of the electron beam B1 arranged first from the −Y direction side is positioned between the first and the second grid lines from the −Y direction side, and in a similar fashion, the irradiation position of the electron beam Bn arranged n-th from the −Y direction side is positioned between the n-th grid line and the (n+1)-th grid line from the −Y direction side.

In the manner described above, in order to expose the cut pattern designed using the grid 400 coordinate values as a reference, the scanning control section 190 moves the irradiation position of the array beam 500 to positions based on this grid 400. Therefore, the scanning control section 190 can expose a frame having a width of n×g between the corresponding first to (n+1)-th grid lines, by scanning the irradiation position of the array beam 500 including n electron beams along the longitudinal direction of the line pattern.

Next, the selecting section 160 selects the charged particle beams to be used for the exposure (S340). The selecting section 160 may determine the cut pattern for the exposure based on the information of the irradiation position of the array beam received from the scanning control section 190. The Y coordinates of the cut pattern are designed to be substantially equal on the grid 400, and therefore the selecting section 160 can expose the first pattern 410 having a width of 4 g by radiating the four electron beams B5 to B8 while scanning with the irradiation position of the array beam 500 along the longitudinal direction of the line pattern, for example.

In other words, in order to perform exposure of the first pattern 410, the selecting section 160 selects the four electron beams B5 to B8 as the electron beams to be used for the exposure. Then, the electron beam B5 is used for exposure of a partial pattern 418 of the first pattern 410, the electron beam B6 is used for exposure of a partial pattern 416 of the first pattern 410, the electron beam B7 is used for exposure of a partial pattern 414 of the first pattern 410, and the electron beam B8 is used for exposure of a partial pattern 412 of the first pattern 410.

Here, the selecting section 160 can select the electron beams to be used for the exposure according to the values of the Y coordinates of the cut pattern. For example, in response to the Y coordinate values of the second pattern 420 being positioned between the first and third grid lines from the −Y direction side, the selecting section 160 selects the electron beams B1 and B2 having irradiation positions in this region. Furthermore, in response to the Y coordinate values of the third pattern 430 being positioned between the third and seventh grid lines from the −Y direction side, the selecting section 160 selects the electron beams B3 to B6 having irradiation positions in this region.

In this way, the electron beam B1 is used for exposure of a partial pattern 422 of the second pattern 420, and the electron beam B2 is used for exposure of a partial pattern 424 of the second pattern 420. Furthermore, the electron beam B3 is used for exposure of a partial pattern 432 of the third pattern 430, the electron beam B4 is used for exposure of a partial pattern 434 of the third pattern 430, the electron beam B5 is used for exposure of a partial pattern 436 of the third pattern 430, and the electron beam B6 is used for exposure of a partial pattern 438 of the third pattern 430.

The selecting section 160 detects the irradiation positions that are to be irradiated by the selected electron beams. The selecting section 160 detects the irradiation positions to be irradiated according to the cut pattern as designated irradiation positions. The selecting section 160 detects the designated irradiation positions according to the time that has passed since the irradiation positions of a plurality of charged particle beams passed by predetermined reference positions in the longitudinal direction of the line pattern.

FIG. 5 shows an example of two reference positions determined in advance in the longitudinal direction of the line pattern, which are a first reference position and a second reference position. Specifically, the region between the first reference position and the second reference position is set as the exposure range, and the selecting section 160 detects the designated irradiation position of each of the plurality of electron beams according to the time that has passed since the irradiation position of the corresponding array beam 500 passed through the first reference position.

In addition to this, three or more reference positions may be determined in advance in the longitudinal direction of the line pattern. Specifically, a single frame is divided into a plurality of exposure regions, and the selecting section 160 may detect the designated irradiation position of each of the plurality of electron beams for each exposure range. In this case, the selecting section 160 detects each designated irradiation position according to the reference position that was most recently passed from among the plurality of reference positions in the longitudinal direction of the line pattern at the irradiation position of the charged particle beams and the time that has passed since this reference position was passed. The selection of the electron beams by the selecting section 160 and the detection of the irradiation positions is described below using FIGS. 6 and 7.

Figure 6:
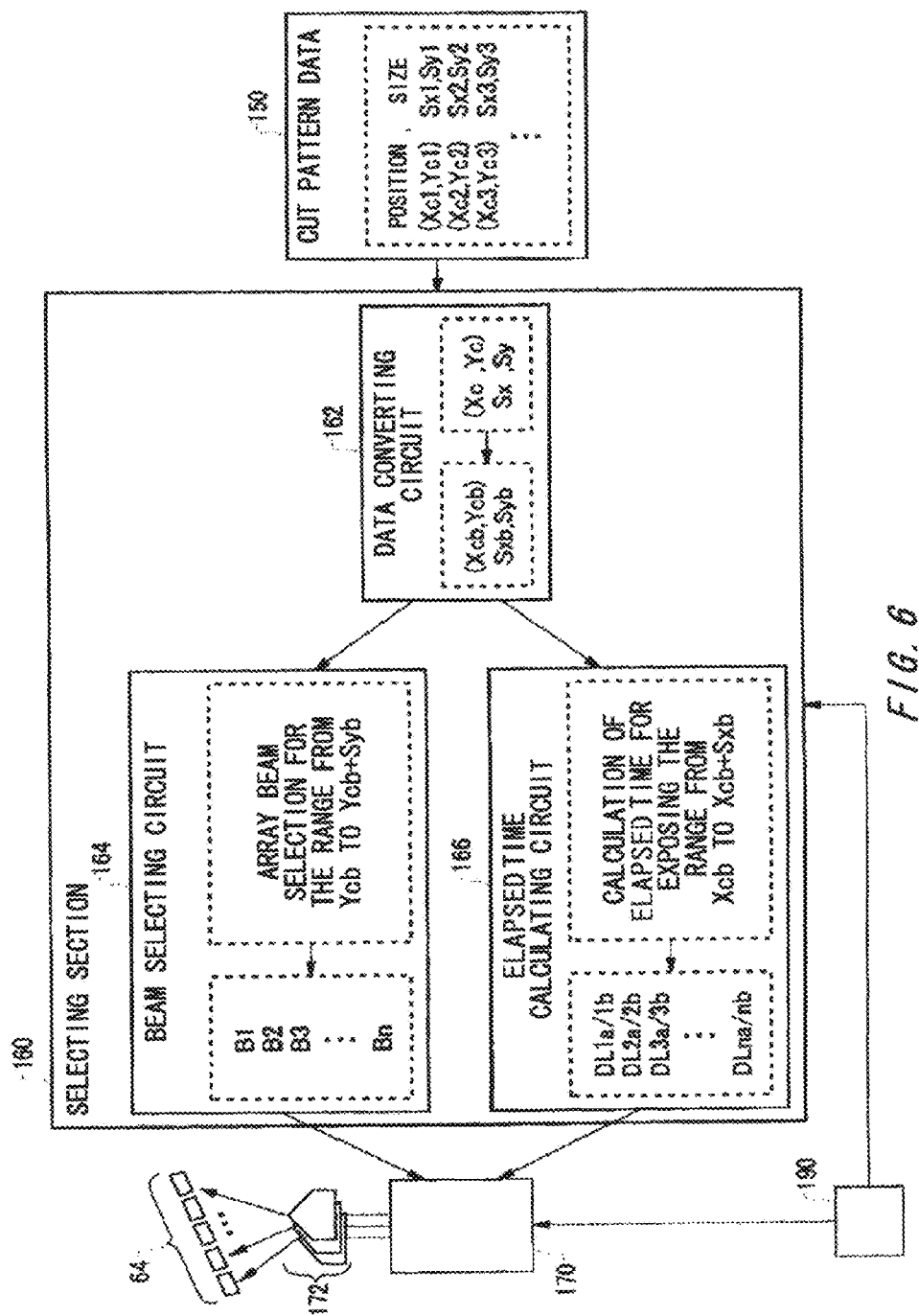
FIG. 6 shows an example of the selecting section 160 according to the present embodiment.

FIG. 6 shows an example of the selecting section 160 according to the present embodiment. The selecting section 160 includes a data converting circuit 162, a beam selecting circuit 164, and an elapsed time calculating circuit 166.

The data converting circuit 162 acquires the cut pattern data from the storage section 150 and converts this cut pattern data into a coordinate system relating to the configuration of the line pattern on the sample 10. The data converting circuit 162 acquires (Xci, Yci), Sxi, Syi (i=1, 2, 3, etc.) as the cut pattern data from the storage section 150, for example, and converts this data into (Xcbi, Ycbi), Sxbi, Sybi (i=1, 2, 3, etc.) that is exposure data in a coordinate system on the sample 10. Here, the Y coordinate values Yci and Syi of the cut pattern data are values that are integer multiples of the grid width g, and therefore the values Ycbi and Sybi resulting from the conversion are also discrete values.

The data conversion performed by the data converting circuit 162 is intended to correct the rotational error caused when the sample 10 is loaded onto the stage section 110 and the deformation error of the sample 10 caused by going through the device manufacturing processes such as etching and film formation of the sample 10, for example. In other words, if the precision of the stage section 110, the precision of the manufacturing process, and the like are sufficiently high, this correction is a data conversion for correcting the distance error to be approximately 10 ppm or less and the angle error to be approximately 1 mrad or less.

For example, in a case where the pattern width Sxi, Syi is from tens to hundreds of nanometers, even if this data conversion is performed, the resulting change will be less than 0.1 nm. In other words, in this case, when the processing is performed to round off 0.1 nm or less, the expressions Sxi=Sxbi and Syi=Sybi are established. Accordingly, when the rotational error and the deformation error occurring at the sample 10 are within a predetermined range, the selecting section 160 may omit the data conversion relating to Sxi and Syi performed by the data converting circuit 162.

The beam selecting circuit 164 selects the electron beams to be used for the exposure based on the exposure data (Xcb, Ycb), Sxb, Syb. For example, in a case where the Y direction coordinates of the grid 400 shown in FIG. 5 are Yc1, Yc2, . . . , Yc8 from the −Y direction side, the beam selecting circuit 164 selects the electron beam B1 as the electron beam to be used for the exposure in the Y coordinate range from Yc1 to Yc2. Specifically, for the cut pattern positioned from the coordinate Ycb to the coordinate Ycb+Syb, the beam selecting circuit 164 selects the electron beams B1, B2, . . . . Bn to be used for the exposure to be the electron beams corresponding to this coordinate range.

For each of the electron beams B1 to Bn selected by the beam selecting circuit 164, the elapsed time calculating circuit 166 detects the timing for switching the electron beam to the ON state or the OFF state. The elapsed time calculating circuit 166 detects this timing based on the X coordinate of the exposure data, and outputs the result as the elapsed time, for example. Here, the elapsed time is the time until each electron beam included in the array beam 500 is set to the ON state or the OFF state, with the time at which the array beam passed through the reference position as the origin.

The scanning control section 190 scans with the array beam 500 in the +X direction or the −X direction, which are the longitudinal directions of the line pattern. In a case where the cut pattern data is expressed by the exposure data (Xcb, Ycb), Sxb, Syb and the scanning control section 190 scans with the array beam 500 in the +X direction, by causing an electron beam to be in the ON state at the time when the irradiation position of the electron beam corresponding to the X-axis coordinate reaches the position Xcb and causing the electron beam to be in the OFF state when the irradiation position reaches the position Xcb+Sxb, it is possible to perform exposure within the pattern region of the cut pattern with this electron beam. In other words, the elapsed time calculating circuit 166 detects the elapsed time to be the time from a timing when the array beam 500 has passed through the first reference position on the −X side of the exposure range to a timing when the electron beam has been switched to the ON state and the OFF state.

On the other hand, when the scanning control section 190 scans with the array beam 500 in the −X direction, by causing an electron beam to be in the ON state at the time when the irradiation position of the electron beam corresponding to the X-axis coordinate reaches the position Xcb+Sxb and causing the electron beam to be in the OFF state when the irradiation position reaches the position Xcb, it is possible to perform exposure within the pattern region of the cut pattern with this electron beam. In this case, the elapsed time calculating circuit 166 detects the elapsed time to be the time from a timing when the array beam 500 has passed through the second reference position on the +X side of the exposure range to the timing when the electron beam has been switched to the ON state and the OFF state.

When a plurality of reference positions are set within a frame, the elapsed time calculating circuit 166 may detect the elapsed time to be from the timing when the reference position most recently passed among the plurality of reference positions was passed to the timing when the electron beam is switched to the ON state and the OFF state. For example, the elapsed time calculating circuit 166 calculates the elapsed time according to the velocity at which the scanning control section 190 scans with the array beam 500 in the longitudinal direction of the line pattern. In this case, the scanning control section 190 preferably performs exposure while continuously moving the array beam 500 in the frame, and when performing scanning in the longitudinal direction of the line pattern, the scanning control section 190 may control the velocity V of the array beam 500 such that the velocity V changes smoothly and at least does not become zero.

When the scanning control section 190 scans with the array beam 500 in the +X direction, the first reference position has an X coordinate S, the pattern start position of the cut pattern for the exposure is Xcb, and the pattern width, i.e. the pattern width in the X-axis direction, is Sxb, the elapsed time calculating circuit 166 can calculate the elapsed time (DLa) until the electron beam is set to the ON state using the expression shown below. The elapsed time calculating circuit 166 may receive information concerning the velocity V from the scanning control section 190.

$DLa=(Xcb-S)/V$    Expression 1:

The elapsed time calculating circuit 166 can calculate the elapsed time (DLb) until the electron beam is set to the OFF state at the pattern end position Xcb+Sxb using the expression shown below.

$DLb=(Xcb+Sxb-S)/V$    Expression 2:

For the electron beams B1, B2, . . . , Bn selected by the beam selecting circuit 164, the elapsed time calculating circuit 166 respectively calculates the elapsed times until the electron beams are set to the ON state to be $DL1a$, $DL2a$, . . . , $DLna$. Furthermore, the elapsed time calculating circuit 166 respectively calculates the elapsed times until the electron beams are set to the OFF state to be $DL1b$, $DL2b$, . . . , $DLnb$.

In this way, the beam selecting circuit 164 and the elapsed time calculating circuit 166 respectively perform the selection of the electron beams to be used for the exposure and the detection of the elapsed time, corresponding to the cut pattern for the exposure. The selecting section 160 supplies the irradiation control section 170 with the selection result of the beam selecting circuit 164 and the detection result of the elapsed time calculating circuit 166.

Next, the exposure control section 140 controls the radiation of the charged particle beams while scanning with the irradiation position of the array beam 500 (S350). Specifically, the scanning control section 190 scans with the irradiation position of the array beam 500 with a velocity V by moving the stage section 110, and supplies the irradiation control section 170 with the irradiation position of the array beam 500 based on the position detection result of the detecting section 114. The irradiation control section 170 generates the signal for switching the ON/OFF state of the beam and sets this signal in the drive circuit 172 in order to control the radiation of a selected electron beam, according to the irradiation position of the array beam 500 and the elapsed time. The drive circuit 172 receives the signals for switching the ON/OFF state of the selected electron beams from the irradiation control section 170, and supplies the corresponding blanking electrodes 64 of the blanking section 60 with the blanking voltage for beam blanking.

Figure 7:
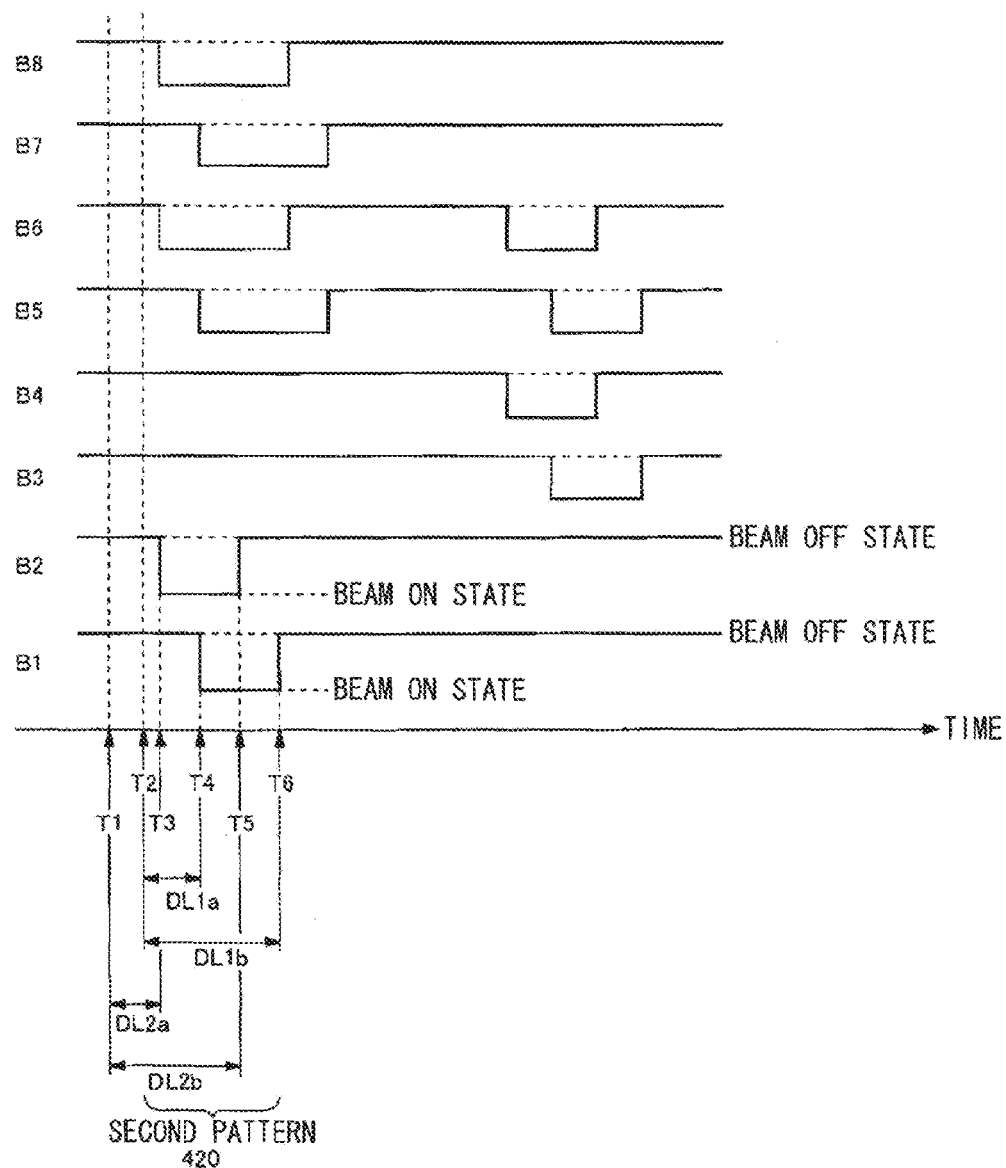
FIG. 7 is an exemplary timing chart for the control signals output to the blanking electrodes 64 by the irradiation control section 170 according to the present embodiment.

FIG. 7 is an exemplary timing chart of the signals for switching the ON/OFF state of the beams. As an example, FIG. 7 shows the timing of the blanking operation for the electron beams B1 to B8 for exposure of the cut pattern in the exposure range shown in FIG. 5. In FIG. 7, the horizontal axis is the time axis.

The eight control signals shown in FIG. 7 are examples of the blanking operation timing signals corresponding to the electron beams B1 to B8. Specifically, when this signal level is in a high state, the irradiation control section 170 supplies a blanking voltage corresponding to this high-state signal level to the blanking electrode 64, thereby causing the corresponding electron beam to be deflected and setting this electron beam to the OFF state. Furthermore, when this signal level is in a low state, the irradiation control section 170 sets the blanking voltage supplied to the blanking electrode 64 to be 0 V according to the low-state signal level, thereby causing the corresponding electron beam to be passed and setting this electron beam to the ON state.

On the time axis, the timing shown by T1 is the timing at which the second column including the electron beams B2, B4, B6, and B8 passes the first reference position. Furthermore, the timing shown by T2 is the timing at which the first column including the electron beams B1, B3, B5, and B7 passes the first reference position. Here, T2−T1=δ/V.

The signals shown by B1 and B2 in FIG. 7 are the timing signals for exposure of the second pattern 420 of the cut pattern shown in FIG. 5 using the electron beams B1 and B2. The selecting section 160 selects the electron beams B1 and B2 based on the cut pattern data of the second pattern 420, and detects the elapsed time. FIG. 7 shows an example in which the irradiation control section 170 generates the blanking operation timing signals B1 and B2 according to the elapsed time.

The irradiation control section 170 switches the electron beam B1 from the OFF state to the ON state at the timing T4, which occurs when the elapsed time DL1a has passed from the timing T2 at which the irradiation position of the electron beam B1 passed through the first reference position. The irradiation control section 170 switches the electron beam B1 from the ON state to the OFF state at the timing T6, which occurs when the elapsed time DL1b has passed from the timing T2.

The irradiation control section 170 switches the electron beam B2 from the OFF state to the ON state at the timing T3, which occurs when the elapsed time DL2a has passed from the timing T1 at which the irradiation position of the electron beam B2 passed through the first reference position. The irradiation control section 170 switches the electron beam B2 from the ON state to the OFF state at the timing T5, which occurs when the elapsed time DL2b has passed from the timing T1.

In this way, the irradiation control section 170 can generate the timing signals for controlling radiation of the electron beams according to the elapsed time and the selection result of the selecting section 160 and the position information of the irradiation position of the scanning performed by the scanning control section 190. By causing the blanking electrodes 64 to operate based on the timing signals generated by the irradiation control section 170, the column section 120 can expose the second pattern 420 of the cut pattern on the sample 10.

Similarly, the irradiation control section 170 generates the control signals of the electron beams B3 to B8 selected by the selecting section 160 to expose the first pattern 410 and the third pattern 430 on the sample 10. In the manner described above, the irradiation control section 170 according to the present embodiment controls the operation of switching the electron beams to the ON state and the OFF state based on the time that has passed from the timing at which the irradiation position passes a reference position. Therefore, there are cases where the length of the exposure range from the first reference position to the second reference position is defined according to the number of bits of a clock that counts the elapsed time.

The smallest period of this clock may be set according to a predetermined position resolution and stage velocity. For example, in a case where the data step of the exposure position is 0.125 nm, when the position resolution is set to a value of 0.0625 nm that is half of the data step and the maximum movement velocity of the stage is set to 50 mm/sec, the clock period is desired to have a minimum of 1.25 ns. Here, when the number of count bits of the clock counter is 12 bits (=4096), the count can be performed up to an elapsed time of approximately 5 μs. During this elapsed time, the stage moves 0.25 μm with the maximum movement velocity of 50 mm/sec.

In this way, the exposure apparatus 100 of the present embodiment can design the exposure range length in advance based on the clock period. By providing a plurality of reference positions and controlling the radiation of the electron beams based on the elapsed time from each reference position, the exposure apparatus 100 can expose a frame having an exposure range that is longer than the above exposure range.

Specifically, for all of the exposure ranges included in one frame, the exposure control section 140 scans with the irradiation position of the array beam 500 and controls the radiation of the electron beams based on the elapsed time from the reference position for each reference position that is passed. In other words, the exposure control section 140 performs exposure by controlling the plurality of electron beams while scanning with the irradiation position of the array beam 500 in the exposure range from the first reference position to the subsequent second reference position shown in the example of FIG. 5.

In a case where a further reference position is included in the frame, the exposure control section 140 continues exposing this frame (S360: No) and returns to step S340 for selecting the charged particle beams, in order to expose the next exposure range from the second reference position to the third reference position. The exposure control section 140 repeats the operations from S340 to S350 for this frame, until there are no more reference positions passed by the irradiation position of the array beam 500. While the scanning control section 190 is scanning the exposure range from the reference position most recently passed by the irradiation position of the array beam 500 to the subsequent reference position, the selecting section 160 may perform the detection of the elapsed time and the selection of the electron beams corresponding to a following exposure range that follows after the subsequent reference position. In this way, the exposure control section 140 can perform exposure of adjacent exposure ranges continuously over time.

In a case where there are no further reference positions in the frame (S360: Yes), the exposure control section 140 ends the exposure of this frame. In a case where there is a subsequent frame to be exposed (S370: No), the process returns to S320 and irradiation position of the array beam 500 is moved to the start point of the subsequent frame and exposure of this subsequent frame is performed. The exposure control section 140 repeats the operations from S320 to S360 until there are no more frames to be exposed. In a case where there are no more frames to be exposed (S370: Yes), the exposure control section 140 ends the exposure of this frame.

In the manner described above, the exposure apparatus 100 according to the present embodiment divides the possible irradiation region 200 of the array beam into frames and, for each frame, repeats the exposure operation of controlling the plurality of electron beams while scanning with the irradiation position of the array beam 500 in the longitudinal direction of the line pattern, thereby exposing the possible irradiation region 200. By moving the sample 10 with the stage section 110, the exposure apparatus 100 can form a plurality of different possible irradiation regions 200 on the front surface of the sample 10, and can therefore perform exposure of the entire line pattern formed on the front surface of the sample 10 with a single column section 120.

Figure 8:
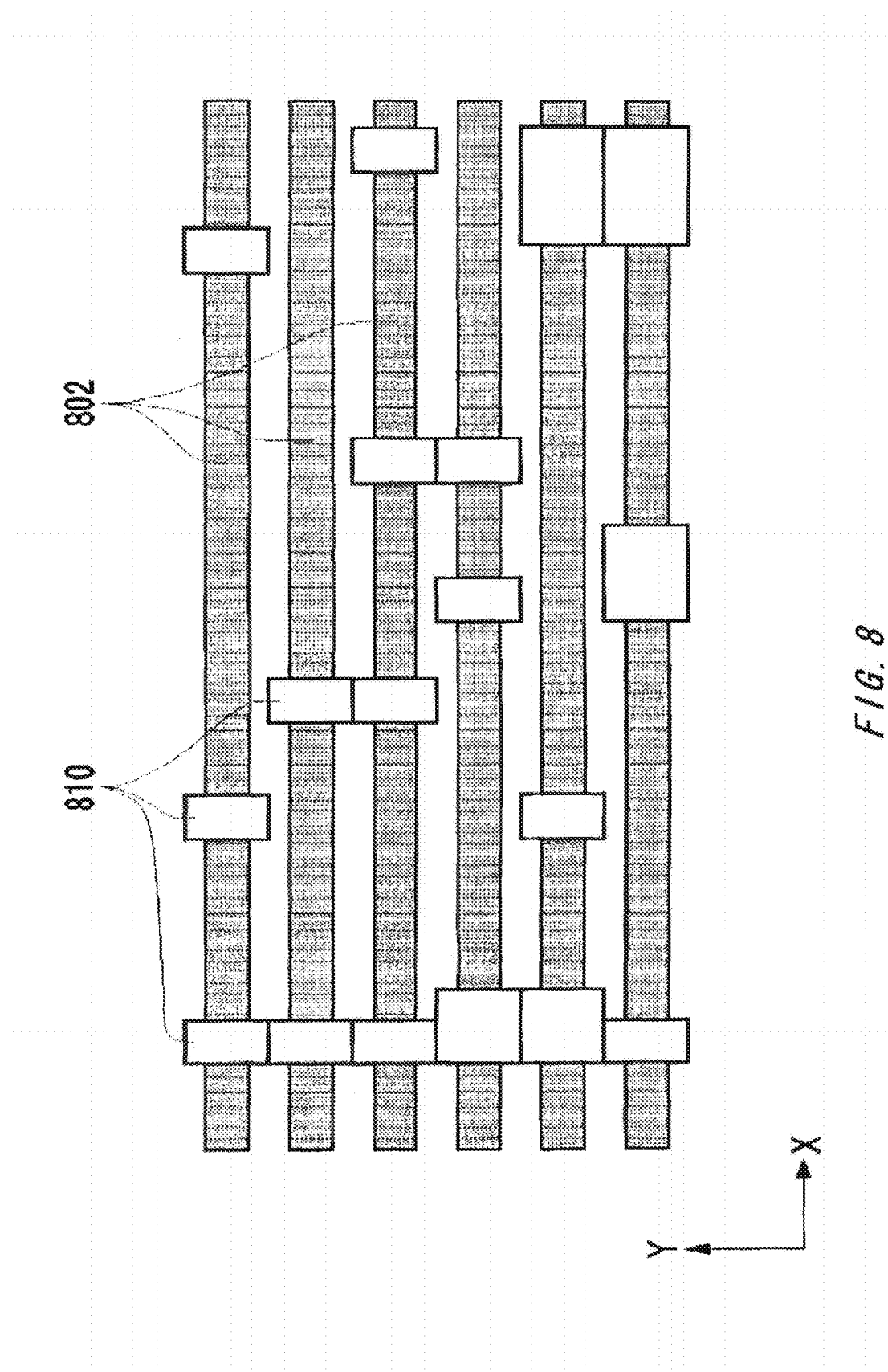
FIG. 8 shows an exemplary line pattern 802 formed on the front surface of the sample 10.

FIG. 8 shows an exemplary line pattern 802 formed on the front surface of the sample 10. The exposure apparatus 100 according to the present embodiment exposes the region displayed by the cut pattern 810 in the resist formed on the line pattern 802, by performing the operation described in FIG. 3. Through this exposure, the resist in the region of the cut pattern 810 can be removed, and therefore the line pattern 802 positioned at this cut pattern is exposed and the exposed line pattern 802 can be etched to form a fine wire pattern or the like.

Figure 9:
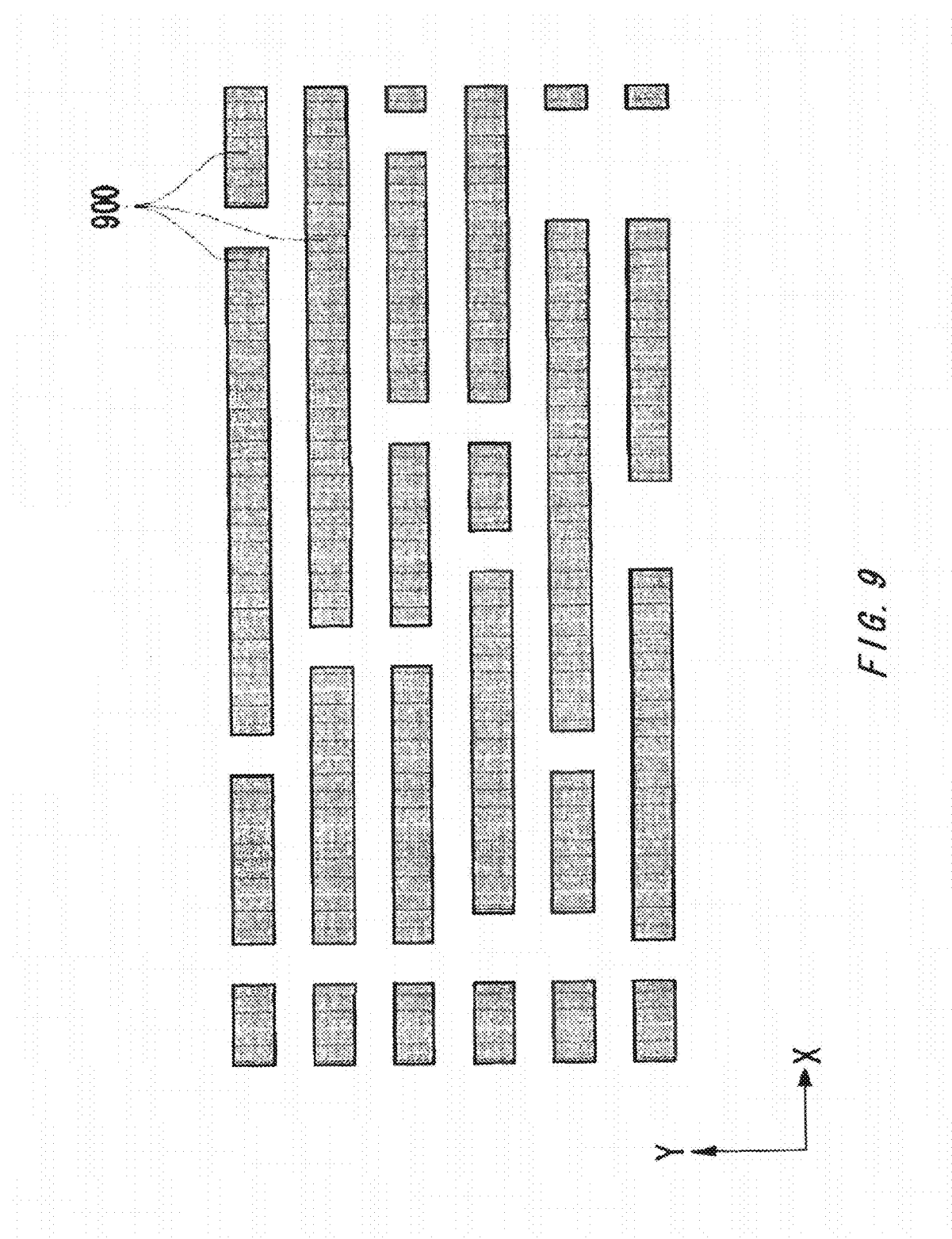
FIG. 9 shows an exemplary fine wire pattern 900 formed on the front surface of the sample 10.

FIG. 9 shows an exemplary fine wire pattern 900 formed on the front surface of the sample 10. With the exposure apparatus 100 according to the present embodiment, a finer wire pattern 900 can be formed by exposing the sample 10 on which the line pattern is formed in advance. For example, the line pattern 802 shown in FIG. 8 is a simple line and space pattern, and therefore it is possible to form the pattern with a line width and line interval of approximately 10 nm by using optical exposure technology. By using the exposure apparatus 100 according to the present embodiment that utilizes electron beams, this line pattern 802 can be machined, and therefore it is possible to form a fine wire pattern 900 that cannot be formed merely by optical exposure technology, such as a gate electrode. By using optical exposure technology to form the line pattern 802, it is possible to reduce the total machining time needed to form the fine wire pattern 900.

Furthermore, the coordinates of the cut pattern and the configuration of the irradiation position of the array beam 500 is based on the grid used for designing the line pattern 802, and therefore the exposure control section 140 can perform fine exposure with a simple control operation, without requiring complex feedback control. In the above description, the exposure apparatus 100 according to the present embodiment is described as an electron beam exposure apparatus that utilizes electron beams, but the present invention is not limited to this, and the present invention can be applied in the same manner to exposure apparatuses utilizing various types of charged particle beams. Furthermore, the present embodiment above describes an example of exposure of a cut pattern, but the present invention is not limited to this, and can be applied to the exposure of a via pattern in the same manner.

The exposure apparatus 100 according to the present embodiment describes an example of exposing the sample 10 on which is formed a line pattern having substantially the same line widths and the same line intervals. Instead, the exposure apparatus 100 may expose a sample 10 having formed thereon a line pattern with different line widths and line intervals. In a case where the line pattern is formed with different line widths and line intervals based on the grid, the exposure apparatus 100 can expose the line pattern at the designated irradiation position corresponding to this grid.

Figure 10:
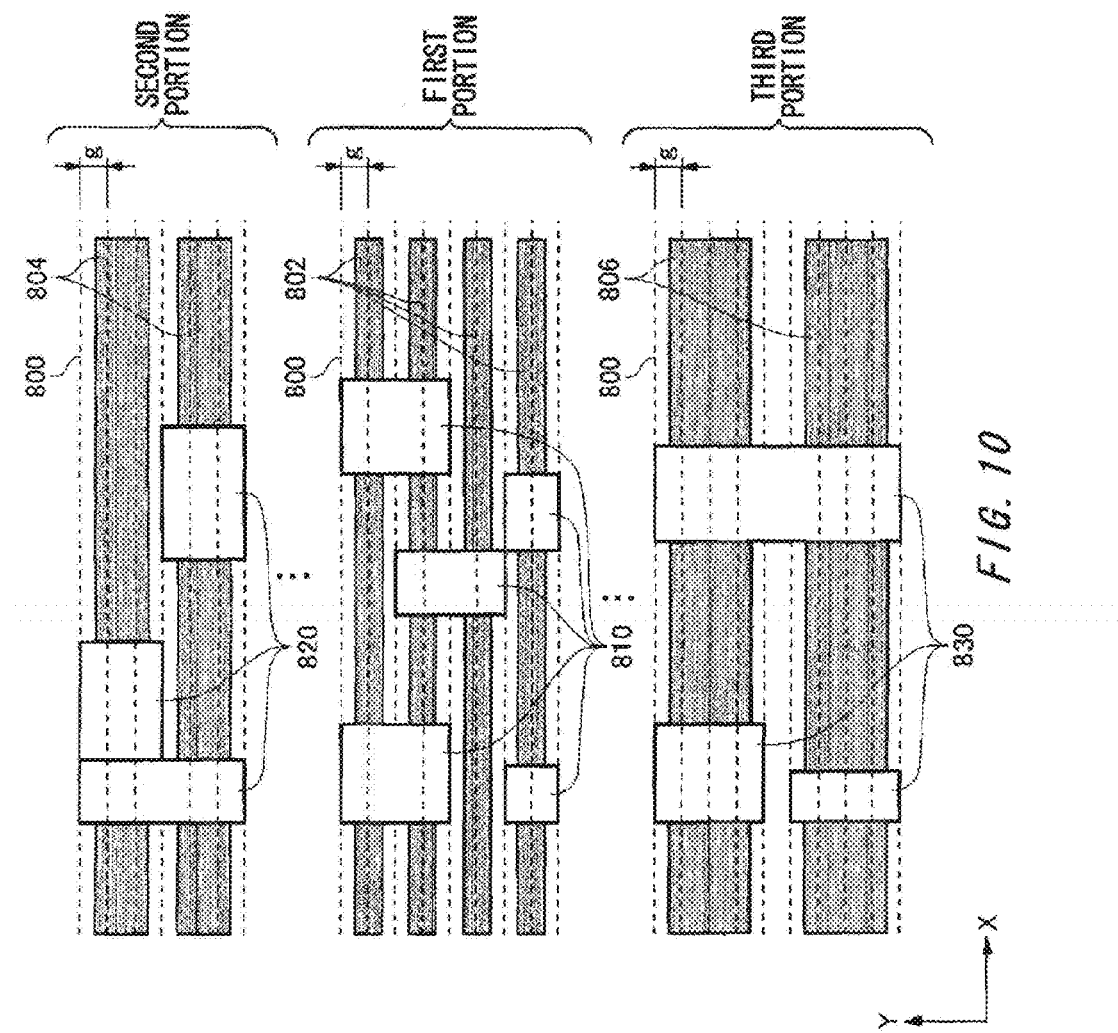
FIG. 10 shows an exemplary sample 10 on which is formed a line pattern having different line widths and different line intervals.

FIG. 10 shows an exemplary sample 10 on which are formed line patterns having different line widths and different line intervals. The sample 10 includes a first portion, and second portion, and a third portion, and the line patterns formed respectively in these portions have different line widths and different line intervals. In this way, even when a plurality of types of line patterns are formed on a single sample 10, each line pattern is designed using a common grid.

In this example, the line pattern 802 of the first portion has a line width of g and a line interval of g, the line pattern 804 of the second portion has a line width of 2 g and a line interval of g, and the line pattern 806 of the third portion has a line width of 3 g and a line interval of 2 g.

In this way, when the widths and the intervals of the line patterns are different, the sizes of the cut patterns 810, 820, and 830 corresponding respectively to these line patterns are also different. In this example, each line pattern is designed based on the same grid 800, and therefore the Y coordinates of each cut pattern can be expressed as discrete coordinates on the grid 800, as described in relation to FIGS. 4 and 5. The irradiation positions of the electron beams correspond to a grid with intervals of g, and therefore the exposure apparatus 100 according to the present embodiment can perform exposure for such cut patterns having different line widths and line intervals.

Figure 11:
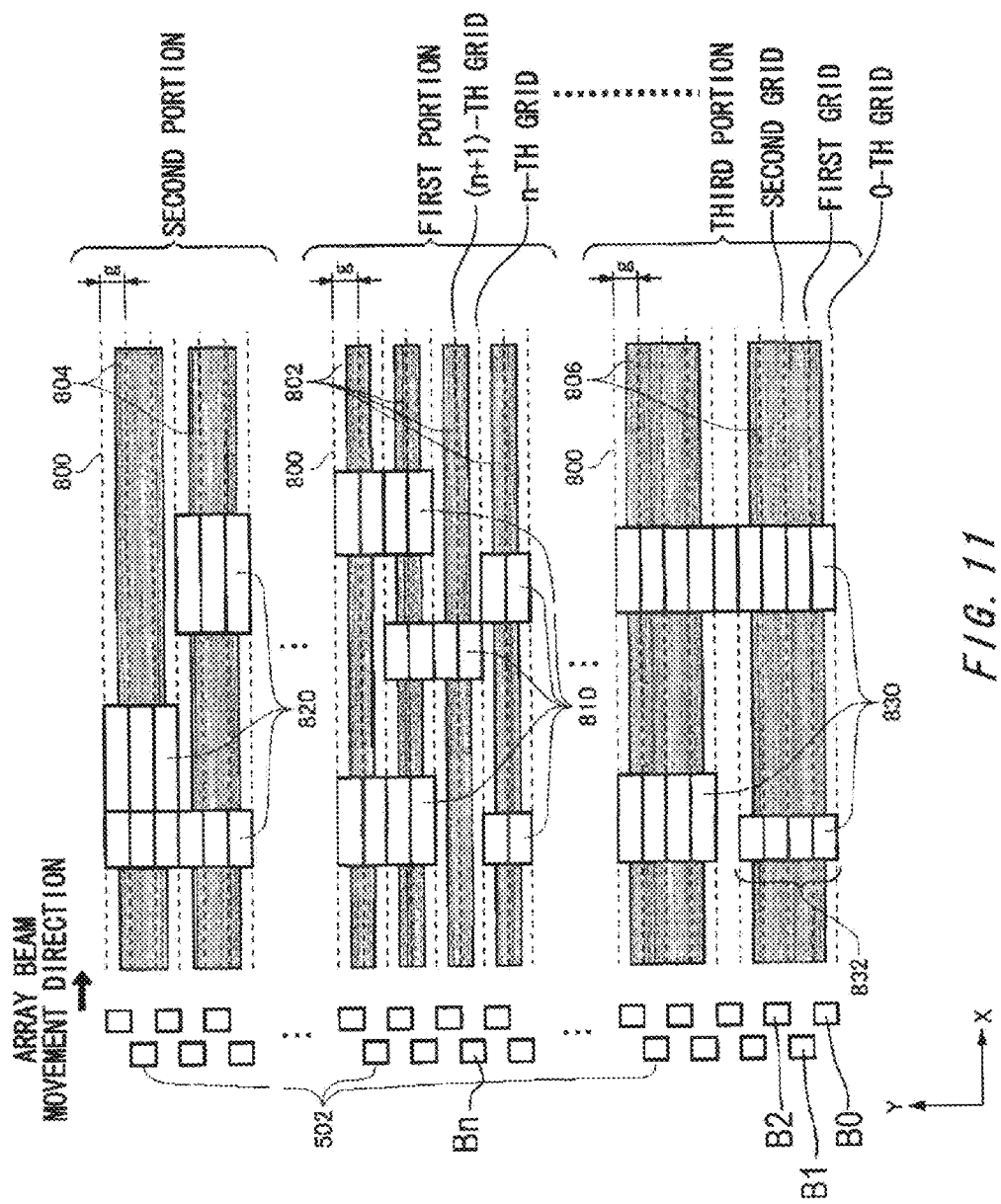
FIG. 11 shows an example in which the irradiation regions 502 of the electron beams according to the present embodiment are arranged in correspondence with the grid 800.

FIG. 11 shows an example in which the irradiation regions 502 of the electron beams according to the present embodiment are arranged in correspondence with the grid 800. Specifically, FIG. 11 shows an example in which the irradiation region of the electron beam Bn arranged as the n-th electron beam counting from the −Y direction side is arranged between the n-th and the (n+1)-th grid lines counting from the −Y direction side, as described in relation to FIG. 5. As a result, when a cut pattern is positioned between the k-th and l-th grid lines, for example, the exposure apparatus 100 can expose this cut pattern by using the k-th to (l−1)-th electron beams.

In other words, in this case, the selecting section 160 selects at least one charged particle beam that is continuous in the width direction from among the plurality of charged particle beams, according to the width of the line pattern at the designated irradiation position. For example, according to the line pattern 802 of the first portion with a line width of g, the selecting section 160 selects two electron beams lined up in the width direction in the array beam in order to expose the cut pattern 810 with a pattern width of 2 g for cutting this line pattern 802.

As another example, according to the line pattern 804 of the second portion with a line width of 2 g, the selecting section 160 selects three electron beams lined up in the width direction in the array beam in order to expose the cut pattern 820 with a pattern width of 3 g for cutting this line pattern 804. Similarly, according to the line pattern 806 of the third portion with a line width of 3 g, the selecting section 160 selects four electron beams lined up in the width direction in the array beam in order to expose the cut pattern 830, such as the cut pattern 832, with a pattern width of 4 g for cutting this line pattern 806. In this way, the selecting section 160 selects m+1 electron beams according to the line width of m×g.

As described in relation to FIGS. 6 and 7, the selecting section 160 detects each irradiation position by determining the elapsed times corresponding to the selected electron beams. In this way, by controlling the radiation of the electron beams while scanning with the irradiation position of the array beam 500, the exposure control section 140 can expose each of the cut patterns 810, 820, and 830. In the example of FIG. 11 as well, the exposure apparatus 100 may scan with the array beam having a beam width of n×g corresponding to the number n of the electron beams, and may expose the sample 10 in each frame having a frame width corresponding to the beam width of n×g. In this way, the exposure apparatus 100 according to the present embodiment can expose the corresponding cut pattern by selecting the suitable electron beams corresponding to the irradiation positions, even when line patterns with different line widths and different line intervals are formed on the sample 10.

Figure 12:
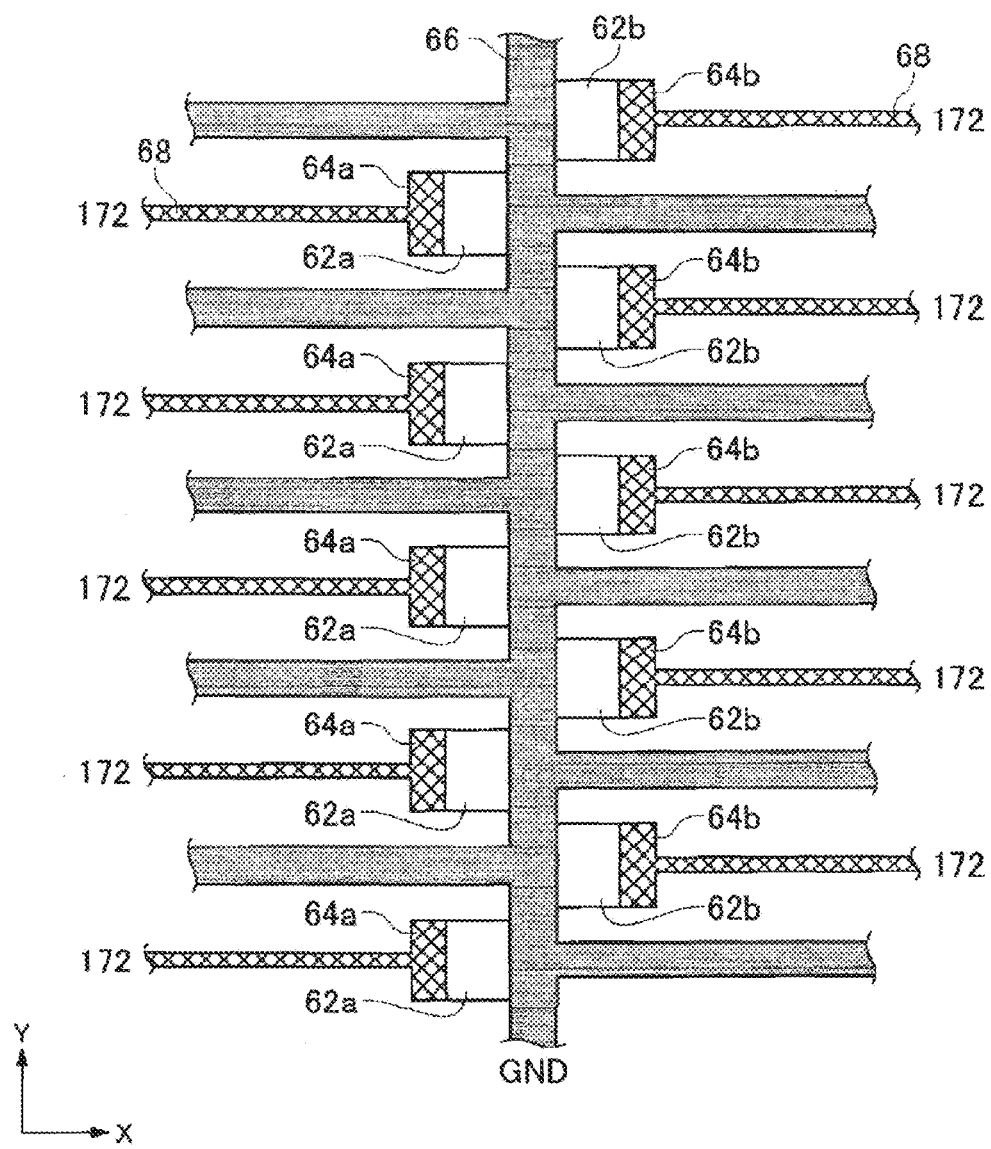
FIG. 12 shows an exemplary blanking section 60 according to the present embodiment.

FIG. 12 shows an exemplary blanking section 60 according to the present embodiment. The blanking section 60 includes a plurality of apertures 62, first blanking electrodes 64a, second blanking electrodes 64b, a common electrode 66, and electrode wires 68.

The apertures 62 each individually pass a corresponding one of the plurality of charged particle beams. The apertures 62 are preferably provided with a number of blanking sections 60 corresponding to the plurality of electron beams output as the array beam. The apertures 62 include a plurality of first apertures 62a and a plurality of second apertures 62b arranged in an offset manner in the X direction, which is a direction corresponding to the longitudinal direction of the line pattern. The first apertures 62a are lined up in the Y direction and offset on the −X direction side, and are formed to correspond to the electron beams B1, B3, B5, B7, etc. shown in FIG. 5, for example. The second apertures 62b are lined up in the Y direction and offset on the +X direction side, and are formed to correspond to the electron beams B0, B2, B4, B6, etc. shown in FIG. 5, for example.

Each first blanking electrode 64a is provided in a manner to form the wall side of a first aperture 62a on the side opposite the common electrode 66. Each second blanking electrode 64b is provided in a manner to form a wall surface of a second aperture 62b that is opposite the common electrode 66. The common electrode 66 is provided in a manner to form a wall surface between the first apertures 62a and the second apertures 62b, in the X direction, and is an electrode shared by the first apertures 62a and the second apertures 62b. The common electrode 66 may also be provided between each of the plurality of apertures 62 and the adjacent apertures 62 lined up in the Y direction.

Each electrode wire 68 connects a first blanking electrode 64a or a second blanking electrode 64b to a corresponding drive circuit 172. The drive circuit 172 receives the switching signal of the irradiation control section 170 that changes according to the selection by the selecting section 160, and supplies the blanking voltages to the first blanking electrodes 64a and the second blanking electrodes 64b to switch the ON state or OFF state of the electron beams.

In the manner described above, the blanking section 60 includes a plurality of apertures 62 lined up in the Y direction in two columns, and therefore the apertures 62 can be arranged continuously without gaps therebetween or overlaps in the Y-coordinate direction while distancing the apertures 62 from each other with the common electrode 66. The irradiation control section 170 can individually control each blanking electrode corresponding respectively to an aperture 62 by individually supplying the signal for switching the electron beam to the ON state and the OFF state to this blanking electrode, and two or more electron beams passed by two or more apertures 62 can form an array beam in which the irradiation region is continuous in the Y-coordinate direction. In other words, by scanning once using this array beam, the exposure apparatus 100 can irradiate the sample 10 in a frame in which the range in which the irradiation by the two or more electron beams is continuous along the Y coordinates as the width of the frame and extends in the X-axis direction.

The blanking section 60 according to the present embodiment described above includes a plurality of apertures 62 lined up in the Y direction in two columns, but instead, the blanking section 60 may include a plurality of apertures 62 lined up in the Y direction in three or more columns. In this case as well, the column section 120 can arrange the Y-coordinate configuration of the apertures 62 continuously while distancing the apertures 62 from each other with the common electrodes 66, and can expose the front surface of the sample 10 by scanning each frame with the array beam. In the example described above, the apertures 62a and the apertures 62b provided in each column are arranged parallel to the Y direction, but the apertures 62a and the apertures 62b may be arranged at positions shifted for each aperture relative to the X direction, e.g. arranged at an inclination relative to the Y direction.

Figure 13:
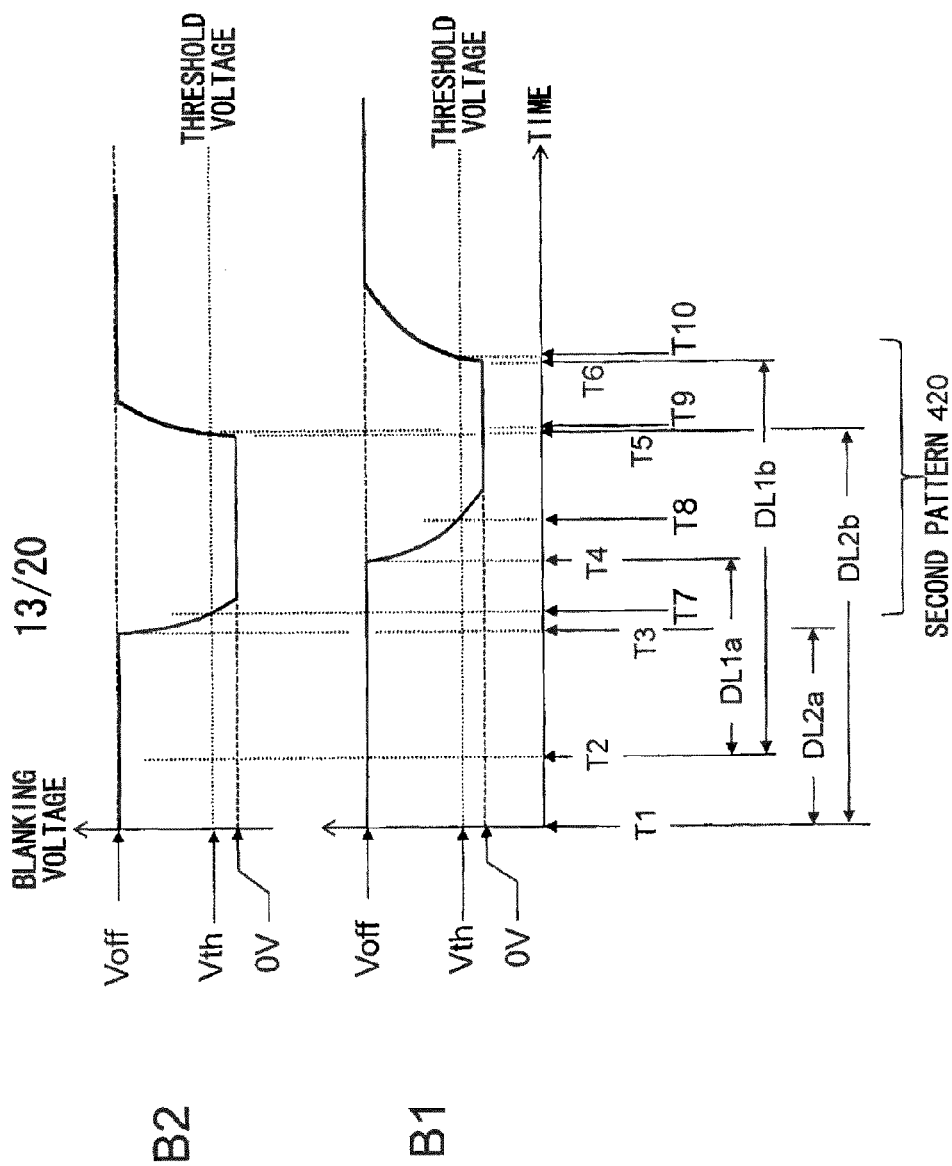
FIG. 13 shows exemplary blanking voltages supplied to the blanking electrodes 64.

FIG. 13 shows output waveforms of the blanking voltages output by drive circuits 172. In this drawing, the blanking voltages supplied to the two blanking electrodes 64 corresponding to the electron beams B1 and B2 are shown. In this drawing, the vertical axis indicates the magnitude of the blanking voltage and the horizontal axis indicates time.

As already described above, the exposure apparatus 100 switches each electron beam between the ON state and the OFF state based on the timing chart shown in FIG. 7, while scanning the array beam along the frame shown in FIG. 2. In other words, when exposing the second pattern 420 shown in FIG. 5, the exposure apparatus 100 scans the array beam along the line direction in the exposure range shown in FIG. 5. For the electron beams B1 and B2 selected by the selecting section 160, the irradiation control section 170 respectively outputs the switching signals for switching the beam state at the timings T4 and T6 and the timings T3 and T5 shown in FIG. 7. In this example, the aperture 62b that passes the electron beam B2 is ahead of the aperture 62a that passes the electron beam B1 in the X direction, and therefore the timing of the switching signal is earlier by a corresponding amount.

The irradiation control section 170 outputs these switching signals to the drive circuits 172 connected to the blanking electrodes corresponding to the electron beams B1 and B2. The drive circuits 172 receive the changes in the switching signals, i.e. the changes of the signals corresponding to the switching of the electron beam between the ON state and the OFF state, and change the blanking voltages being supplied to the blanking electrodes. The blanking electrodes corresponding to the electron beams B1 and B2 change the progression directions of the electron beams according to the changes in the blanking voltages supplied from the drive circuits 172 to switch whether the electron beams B1 and B2 irradiate the sample, thereby exposing the second pattern 420 shown in FIG. 5.

Here, in order to actually switch the beam state, after the irradiation control section 170 has output the switching signals having the blanking voltages, the drive circuits 172 output the blanking voltages according to the switching signals, the blanking voltages of the blanking electrodes 64 must be set to a voltage value causing the electron beams to be in the OFF state or the blanking voltage must be returned to 0 V, and each blanking electrode 64 generates a transient time relating to the transition of the blanking voltage. This drawing describes in detail the transient time relating to the transition of the blanking voltage.

In the blanking voltage on the vertical axis, the voltage value indicated by Voff is the voltage value supplied to a blanking electrode 64 when the beam is in the OFF state. When Voff is supplied to the blanking electrode 64, the electron beam is deflected accordingly and is prevented from progressing by the stopping plate 70 (beam OFF state). Furthermore, the voltage value indicated by 0 V on the vertical axis is the voltage value supplied to the blanking electrode 64 in the beam ON state. When 0 V is supplied to the blanking electrode 64, the electron beam is not deflected by the blanking electrode 64, and passes through the aperture 72 of the stopping plate 70 (beam ON state).

The voltage value indicated by Vth on the vertical axis is the threshold voltage supplied to the blanking electrode 64 at the boundary of the switching between the OFF state and the ON state of the electron beam. In other words, when the voltage value of the blanking electrode 64 is from 0 V to Vth, at least a portion of the electron beam passes through the aperture 72 of the stopping plate 70. When the voltage value of the blanking electrode 64 is from Vth to Voff, the electron beam is completely shifted away from the aperture 72 of the stopping plate 70, and does not pass through the aperture 72.

As shown in the drawing, for the switching signal of the electron beam B1, after the irradiation position of the electron beam B1 has passed through a first reference position at the timing T2, the irradiation control section 170 switches the electron beam B1 from the OFF state to the ON state at the timing T4, which is a time DL1a after the timing T2. However, the blanking voltage supplied to the blanking electrode 64 is delayed because of the transient time according to the transition of the blanking voltage. The blanking voltage of the electron beam B1 begins to decrease at the timing T4, and crosses the threshold voltage Vth at the timing T8. At least a portion of the electron beam B1 begins passing through the aperture 72 of the stopping plate 70 at the timing T8. The electron beam B1 irradiates the sample and is in the beam ON state from the timing T8.

The switching signal of the electron beam B1 is changed by the irradiation control section 170 from the ON state to the OFF state at the timing T6, which is a time DL1b after the timing T2. The blanking voltage of the electron beam B1 begins increasing at the timing T6 and crosses the threshold voltage Vth at the timing T10. The electron beam B1 is in the beam OFF state from the timing T10.

On the other hand, for the switching signal of the electron beam B2, after the irradiation position of the electron beam B2 has passed through a first reference position at the timing T1, the irradiation control section 170 switches the electron beam B2 from the OFF state to the ON state at the timing T3, which is a time DL2a after the timing T1. The blanking voltage of the electron beam B2 begins to decrease at the timing T3, and crosses the threshold voltage Vth at the timing T7. The electron beam B2 irradiates the sample and is in the beam ON state from the timing T7.

Furthermore, the switching signal of the electron beam B2 is changed by the irradiation control section 170 from the ON state to the OFF state at the timing T5, which is a time DL2b after the timing T1. The blanking voltage of the electron beam B2 begins increasing at the timing T5 and crosses the threshold voltage Vth at the timing T9. The electron beam B2 is in the beam OFF state from the timing T9.

In other words, the electron beam B1 experiences a delay time of T8-T4 at the timing when the beam is switched from the OFF state to the ON state, and also experiences a delay time of T10-T6 when the beam is switched from the ON state to the OFF state. Furthermore, the electron beam B2 experiences a delay time of T7-T3 at the timing when the beam is switched from the OFF state to the ON state, and also experiences a delay time of T9-T5 when the beam is switched from the ON state to the OFF state. Here, the delay time described above that occurs when the beam is switched from the OFF state to the ON state is referred to as the "falling time," and the delay time described above that occurs when the beam is switched from the ON state to the OFF state is referred to as the "rising time."

In the exposure apparatus 100 according to the present embodiment, the rising time and the falling time each have a value of approximately 5 ns, as an example. The rising time and the falling time cause a delay of the ON state/OFF state switching timing for the electron beams in the array beam, and cause an error of at most approximately 0.5 nm in the beam irradiation position of the exposure pattern and an error of at most 5% in the beam irradiation amount.

There is a possibility of variation in the values of the falling time and the rising time among the electron beams in the array beam. This is because the size of the load driven by the drive circuit 172 is different for each blanking electrode 64. In other words, in the blanking section 60 having the structure shown in FIG. 12, there are possible variations in each blanking electrode 64, such as the final dimensions of the blanking electrode 64, the common electrode 66, and the electrode wire 68, the intervals between electrodes and between wires, and the like, due to causes in the process occurring during manufacturing. As a result, it is possible for differences to occur in the capacitance value and resistance value of the loads driven by the drive circuits 172 among the blanking electrodes 64.

Figure 14:
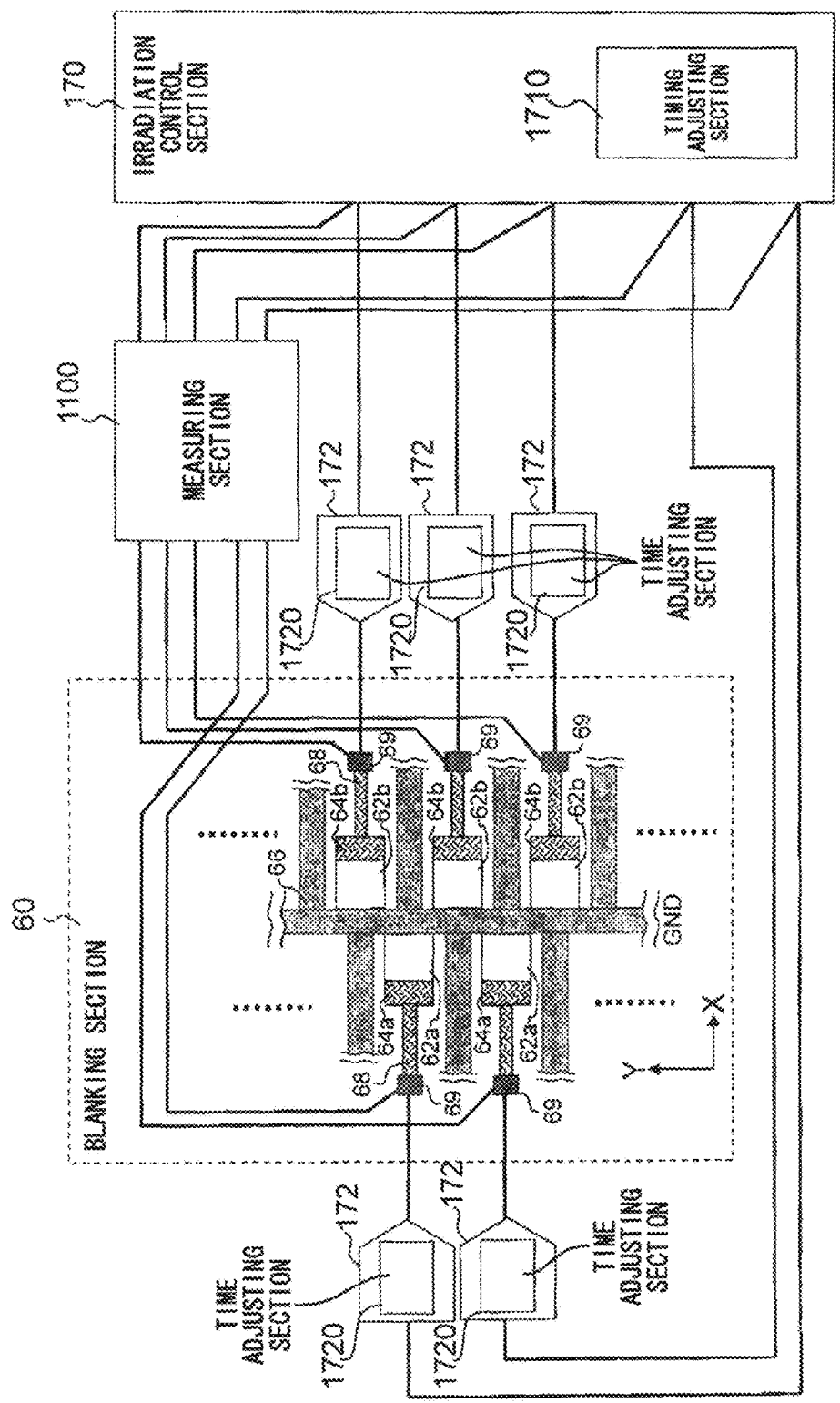
FIG. 14 shows an exemplary configuration of an exposure apparatus 100 according to the present embodiment.

FIG. 14 shows an exemplary configuration of an exposure apparatus 100 according to the present embodiment. Components that have the same operation as components described in other drawings are given the same reference numerals, and detailed descriptions are omitted. The configurational example shown in this drawing corresponds to a portion of the exposure apparatus 100 shown in FIG. 1. The exposure apparatus 100 according to the present embodiment has a function to measure the change over time of the blanking voltage relative to the switching of the beam state, for each of the electron beams in the array beam. Furthermore, the exposure apparatus 100 according to the present embodiment has a function to adjust the time over which the blanking voltage reaches a prescribed threshold voltage for each blanking electrode 64, even when there is variation among the loads driven by the drive circuits 172. The exposure apparatus 100 includes a blanking section 60, a plurality of drive circuits 172, an irradiation control section 170, and also a measuring section 1100.

One end of the measuring section 1100 is connected to the irradiation control section 170, and acquires the ON state/OFF state switching signal of each electron beam. The other end of the measuring section 1100 is electrically connected to each blanking electrode 64 via relay terminals 69. Each relay terminal 69 is arranged between the outputs of a blanking electrode 64 and a drive circuit 172. The measuring section 1100 acquires the blanking voltages applied to the blanking electrodes 64, from the relay terminals 69.

The measuring section 1100 measures the delay amount from when the switching signal changes to when the blanking voltage changes, for each blanking electrode 64, using the change of the switching signal for switching an electron beam from between the ON state and the OFF state acquired from the irradiation control section 170 as a trigger. Furthermore, the measuring section 1100 determines the time needed for the blanking voltage to reach the threshold voltage, i.e. the falling time and the rising time, based on the measured delay amount.

The irradiation control section 170 includes a timing adjusting section 1710. The timing adjusting section 1710 individually adjusts the output timing of the switching signal output by the irradiation control section 170 for each blanking electrode 64. Each drive circuit 172 includes a time adjusting section 1720. The time adjusting section 1720 individually adjusts the transient time of the blanking voltage output by the corresponding drive circuit 172.

Figure 15:
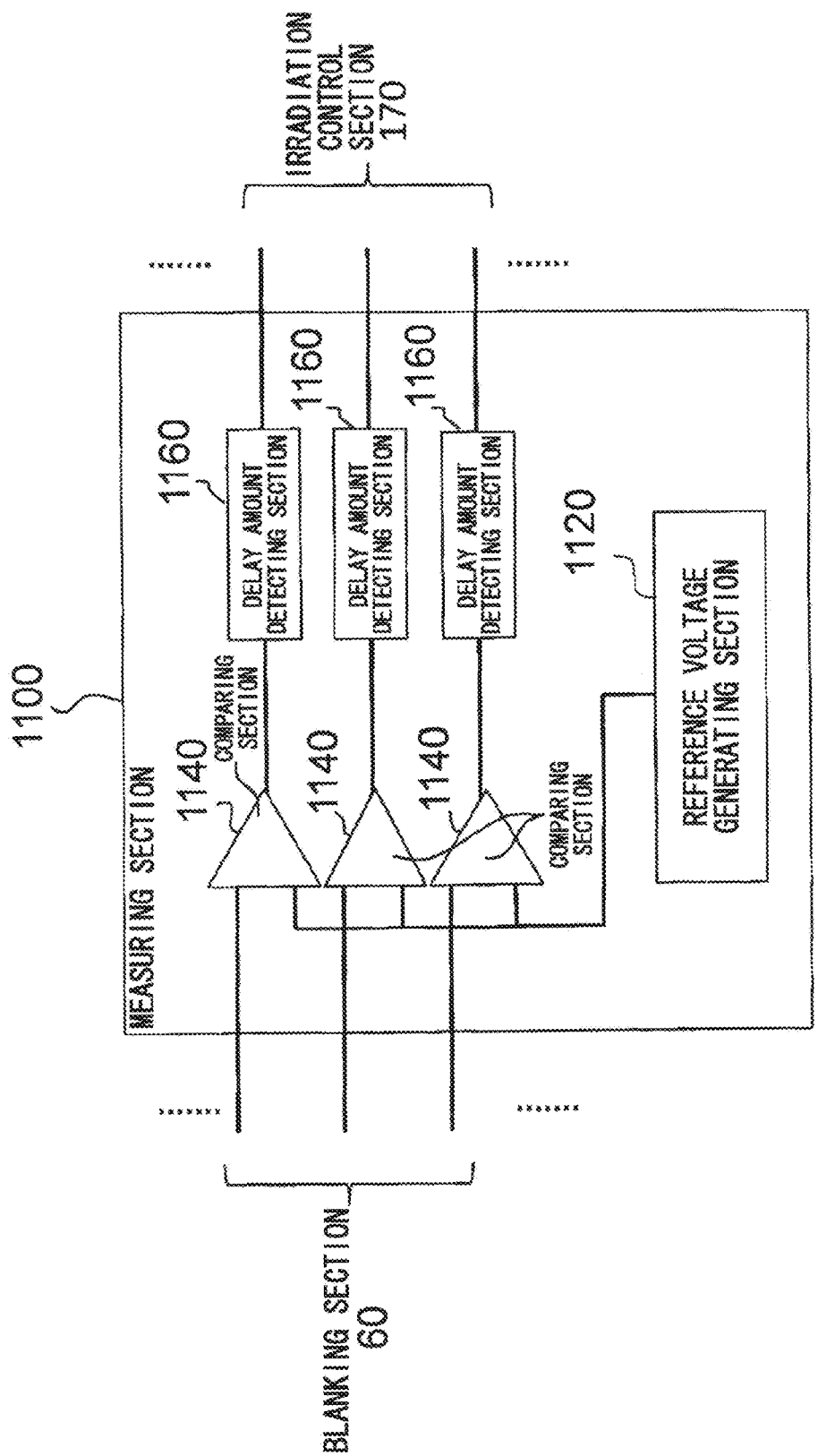
FIG. 15 shows an exemplary configuration of the measuring section 1100.

FIG. 15 shows an exemplary configuration of the measuring section 1100. The measuring section 1100 includes a reference voltage generating section 1120, one or more comparing sections 1140, and one or more delay amount detecting sections 1160. The reference voltage generating section 1120 generates a reference voltage used for a comparison with the blanking voltage. The reference voltage generating section 1120 is capable of generating an arbitrary voltage within the amplitude of change of the blanking voltage, as the reference voltage. As an example, the reference voltage generating section 1120 may generate the reference voltage to be the threshold voltage of the boundary for switching between the beam OFF state and the beam ON state. The reference voltage generating section 1120 supplies the reference voltage to the comparing sections 1140. The comparing sections 1140 are connected to the reference voltage generating section 1120 and to the relay terminals 69 connected to the blanking electrodes 64 within the blanking section 60. Each comparing section 1140 compares the blanking voltage value applied to the corresponding blanking electrode 64 to the reference voltage value acquired from the reference voltage generating section 1120, and outputs to a delay amount detecting section 1160 a voltage value corresponding to the difference between the blanking voltage value and the reference voltage value.

Each delay amount detecting section 1160 acquires the voltage value corresponding to the difference between the blanking voltage value and the reference voltage value from the corresponding comparing section 1140. Furthermore, each delay amount detecting section 1160 acquires the switching signal for switching the corresponding electron beam between the ON state and the OFF state from the irradiation control section 170. Each delay amount detecting section 1160 detects the time from when the switching signal for switching the state of the corresponding electron beam changes, i.e. when there is a change in the switching signal that switches the electron beam from the OFF state to the ON state and from the ON state to the OFF state, to when the absolute value of the difference between the blanking voltage and the reference voltage is less than or equal to 20 mV, for example, i.e. a voltage value corresponding to 1 LSB obtained by dividing the blanking voltage amplitude of 5 V by 256 (=2^8).

The delay amount detecting section 1160 may perform sampling every 1 ns, for example, on the voltage value of the difference between the blanking voltage and the reference voltage following the change of the switching signal, and may detect the time until the sign of the voltage value of the difference inverts between two sample points that are temporally adjacent. In this way, in accordance with switching of the electron beam from the OFF state to the ON state and from the ON state to the OFF state, the delay amount detecting section 1160 detects the time needed for the blanking voltage to reach the reference voltage supplied by the reference voltage generating section 1120 from when the switching signal that is the output of the irradiation control section 170 changes, i.e. the delay amount.

The delay amount detected by the delay amount detecting section 1160 includes the delay time of the signal caused by the wiring from the relay terminal 69 to the measuring section 1100 and the delay time of the signal caused by the circuits within the measuring section 1100. The manufacturer of the exposure apparatus 100 can design and create the thickness and arrangement intervals of the wires from the relay terminals 69 to the measuring section 1100 and the circuits within the measuring section 1100 such that the delay time caused by each blanking electrode 64 becomes sufficiently small relative to the delay amount, which is from when the switching signal of the irradiation control section 170 changes to when the blanking voltage changes. In this way, for each blanking electrode 64, the corresponding delay amount detecting section 1160 is capable of detecting the delay amount from when the switching signal changes to when the blanking voltage reaches the reference voltage.

By repeatedly detecting the delay amount described above while changing the reference voltage value, the measuring section 1100 can measure the relationship between the time passed since the switching signals changed and the value of the blanking voltage, i.e. the transient waveform. Based on the transient waveform measured in this way, the measuring section 1100 can detect the time from when the switching signal changes to when the threshold voltage, which is a prescribed blanking voltage, is reached and can determine the falling time and the rising time.

Figure 16:
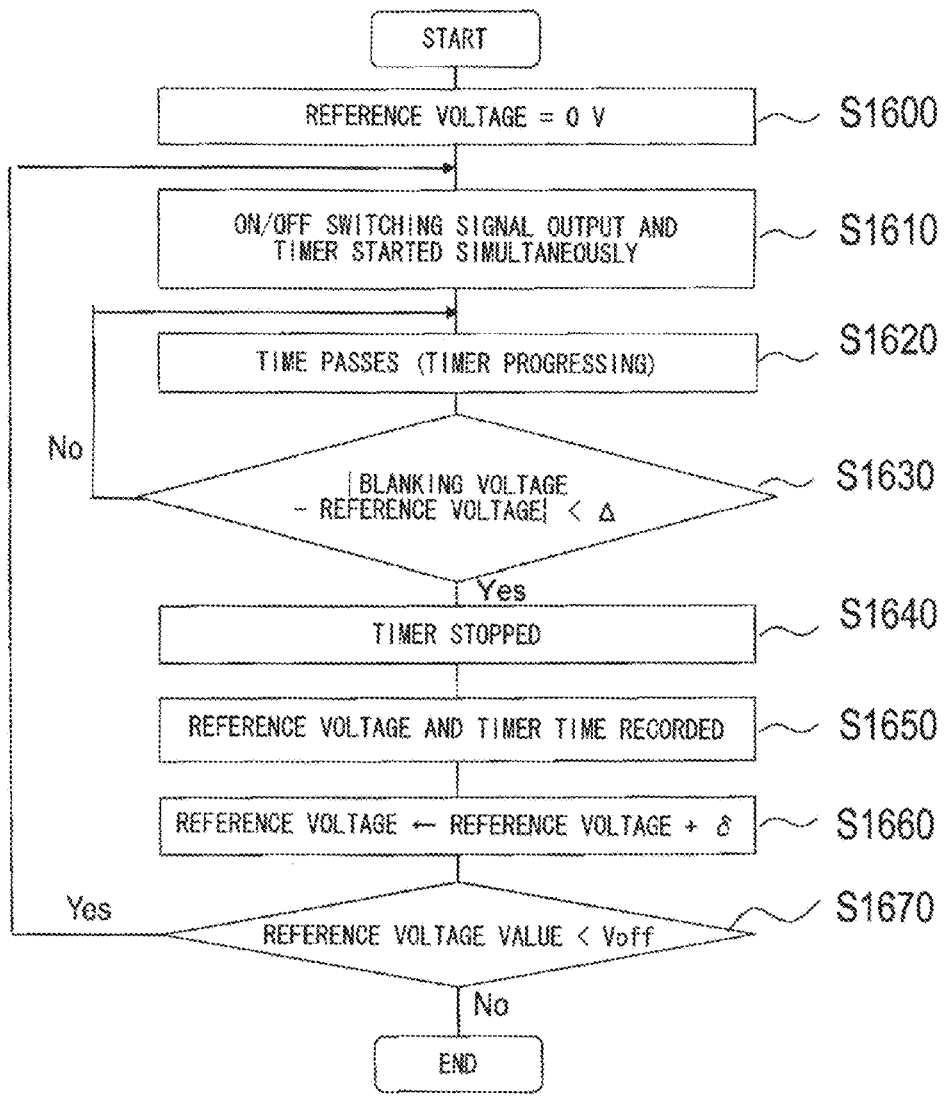
FIG. 16 shows an exemplary measurement flow for measuring the blanking voltage waveform, according to the present embodiment.

FIG. 16 shows an exemplary measurement flow for measuring the transient waveform of the blanking voltage for each blanking electrode 64. This measurement flow includes an irradiation control step of outputting a switching signal for switching the blanking voltage supplied to each of a plurality of blanking electrodes that are provided to correspond to a plurality of charged particle beams and switch whether the sample is irradiated by the corresponding charged particle beams according to an input voltage, and a measurement step of measuring the delay amount from when the switching signal changes to when the blanking voltage changes, for each blanking electrode. By performing the process from S1600 to S1670 for each blanking electrode 64, the measuring section 1100 measures the transient waveforms of the blanking voltages.

The measurement flow for measuring the transient waveform of a blanking voltage performed by the measuring section 1100 is described below using this drawing. First, the reference voltage generating section 1120 generates a reference voltage value of 0 V (S1600). Next, the irradiation control section 170 outputs, to the drive circuit 172 corresponding to the electron beam that is the measurement target, the switching signal for switching this electron beam between the ON state and the OFF state. At the same time, the irradiation control section 170 outputs the change of the switching signal to the delay amount detecting section 1160 corresponding to this drive circuit 172 of the measuring section 1100. The delay amount detecting section 1160 receives this change and starts a measurement timer (S1610).

Furthermore, the delay amount detecting section 1160 acquires the voltage difference between the blanking voltage and the reference voltage from the comparing section 1140. For example, the delay amount detecting section 1160 causes the timer to proceed normally when the absolute value of the voltage difference is greater than a prescribed value delta (e.g. delta=20 mV), and stops the timer when the voltage difference becomes less than or equal to the prescribed value delta (S1620 to S1640). In this way, the delay amount detecting section 1160 detects the time from when the switching signal changes to the time when the blanking voltage value reaches the reference voltage value, i.e. the delay amount. As an example of the process performed in the detection step, the delay amount detecting section 1160 records the time indicated by the timer and the reference voltage value when the timer is stopped (S1650).

Next, the reference voltage generating section 1120 increases the reference voltage by δ (S1660). If the reference voltage value is less than the maximum value Voff of the blanking voltage, the measuring section 1100 proceeds to the processing of step S1610 and performs the processes from S1610 to S1660 for a new reference voltage (S1670: Yes). On the other hand, if the new reference voltage is greater than the maximum value Voff of the blanking voltage at the switching signal step S1670, the measurement flow is ended (S1670: No).

This measurement flow includes a reference voltage generating step of sequentially changing and generating the reference voltage and a detection step of, for each blanking electrode, detecting the delay amount from when the switching signal changes to when the blanking voltage reaches the reference voltage, in response to the reference voltage being changed. After the measurement flow has ended, the relationship between the reference voltage value and the delay amount, i.e. the time from when the switching signal changes to when the blanking voltage value reaches the reference voltage value, which was recorded at step S1650, represents the transient waveform of the blanking voltage from when the switching signal changed. By performing the processes from S1600 to S1670 for each blanking electrode 64 corresponding respectively to the electron beams in the array beam, the measuring section 1100 measures the transient waveform of the blanking voltage from when the switching signal changed for each blanking electrode 64.

The measuring section 1100 determines the falling time and the rising time of the blanking voltage, from the delay amount that is the time needed for the measured transient waveform to cross the predetermined threshold voltage. Furthermore, the measuring section 1100 may generate the predetermined threshold voltage as the reference voltage of the reference voltage generating section 1120, directly measure the delay amount needed for the blanking voltage to reach the threshold voltage, and determine the falling time and the rising time of the blanking voltage.

The measuring section 1100 may perform this measurement flow while the exposure apparatus 100 outputs the electron beams and blanks the electron beams, or may perform this measurement flow in a state where the exposure apparatus 100 does not output the electron beams. In the latter case, the exposure apparatus 100 can determine in advance the transient waveform, the falling time, and the rising time for each blanking electrode 64, in a state where the electron beams are not output.

With the process described above, even when there is variation among the loads of the blanking electrodes driven by the drive circuits 172, the exposure apparatus 100 is capable of adjusting the timing at which the switching signals are output by using the timing adjusting sections 1710 based on the measurement results of the measuring section 1100 and of adjusting the time needed for the blanking voltages to reach the threshold voltage by using the time adjusting sections 1720.

Here, each timing adjusting section 1710 has a function to correct the elapsed time by adding or subtracting an offset time to the elapsed time calculated by the elapsed time calculating circuit 166 (see FIG. 6) for each electron beam, each electron beam falling time, and each electron beam rising time. In this way, for each blanking electrode 64, the timing adjusting section 1710 individually adjusts the output timing of the switching signal output by the irradiation control section 170.

Furthermore, by installing the time adjusting sections 1720 respectively in the drive circuits 172 and changing the drive performance of the drive circuits 172, the time adjusting sections 1720 change the rate of change, i.e. the transient time, of the blanking voltages supplied to the drive circuits 172.

Figure 17:
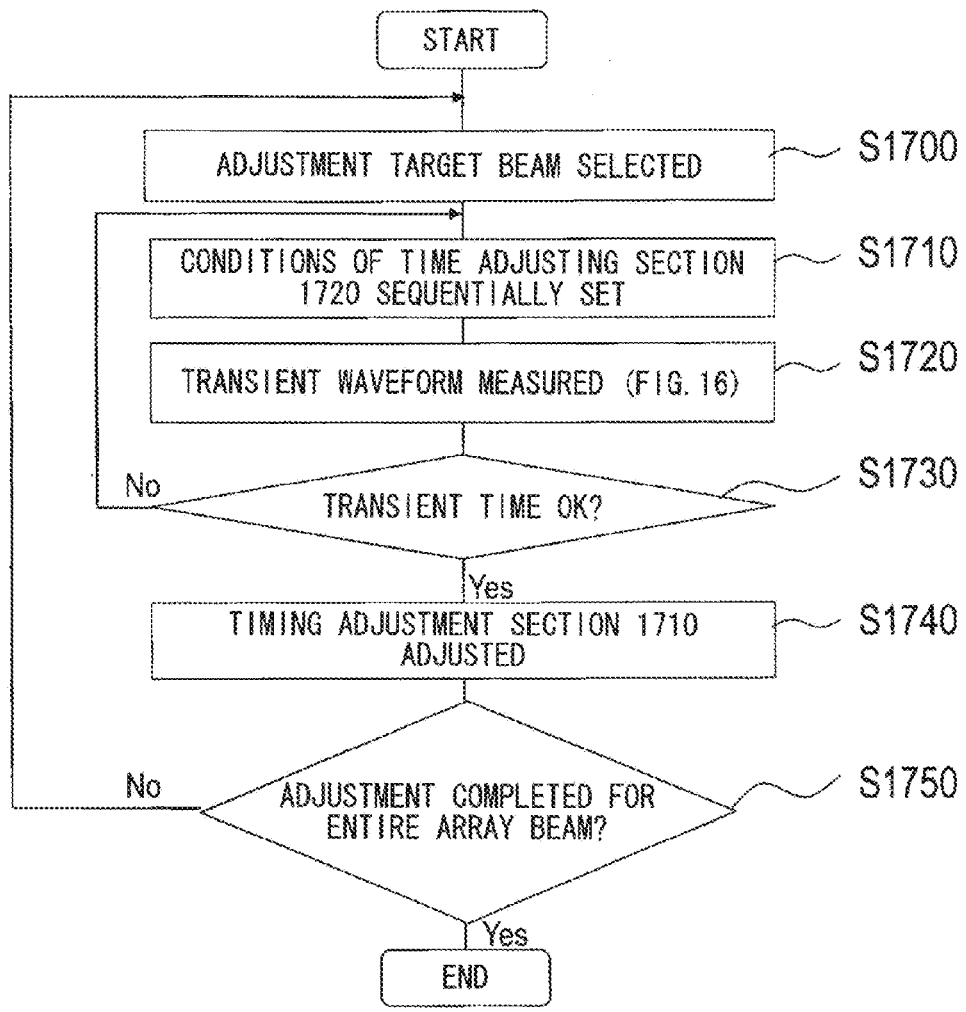
FIG. 17 shows an exemplary adjustment flow of the exposure apparatus 100 according to the present embodiment.

FIG. 17 shows an exemplary adjustment flow of a timing adjusting section 1710 and a time adjusting section 1720 of the exposure apparatus 100. This adjustment flow is an example of an adjustment step for adjusting the time needed for the blanking voltage to reach the prescribed threshold voltage, i.e. the transient time of the blanking voltage, for each blanking electrode. By performing the processes from S1700 to S1750, for all of the electron beams of the array beam including variations among the loads driven by the drive circuits 172, the exposure apparatus 100 individually adjusts the output timing of each switching signal output by the irradiation control section 170, as an example of a timing adjustment step, and individually adjusts the transient time of each blanking voltage supplied to a drive circuit 172, as an example of a time adjustment step. The processes in the earlier part of this flow, i.e. S1710 to S1730, are a process flow for adjusting the transient times of blanking voltages performed by the time adjusting sections 1720, and the process of the later part of this flow, i.e. S1740, is a process flow for adjusting the output timings of the switching signals output by the irradiation control section 170 performed by the timing adjusting sections 1710.

This adjustment flow includes selecting electron beams to be adjustment targets in order (S1700), adjusting the transient time of the blanking voltage for each selected electron beam (S1710 to S1730), and adjusting the output timing of the switching signals (S1740).

The following describes the earlier part of this adjustment flow, i.e. S1710 to S1730. According to instructions of the CPU 130, while sequentially changing the time adjustment conditions of the time adjusting sections 1720 (S1710), the measuring section 1100 and the time adjusting sections 1720 measure the transient waveforms of the blanking voltages for each time adjustment condition (S1720) using the measurement flow shown in FIG. 16, for example. The measuring section 1100 calculates the transient times of the blanking voltages from the transient waveforms. According to instructions from the CPU 130, when a transient time does not match or substantially match (matching to within a range of a predetermined error) a predetermined prescribed value (S1730: No), the measuring section 1100 and the corresponding time adjusting section 1720 repeat S1710 to S1730 while changing the time adjustment condition. When the transient time matches the prescribed value (S1730: Yes), the measuring section 1100 sets a setting value corresponding to the time adjustment condition in this state into the time adjusting section 1720 of the drive circuit 172.

In the above, each drive circuit 172 has a configuration in which a plurality of switch circuits having different weighted drive performances are arranged in parallel, for example. Furthermore, the time adjusting sections 1720 of the drive circuits 172 are capable of selecting a combination of switch circuits to be used from among switch circuits having seven different types of drive performance, i.e. seven switch circuits whose drive performances sequentially double, according to a 7-bit digital value corresponding to the time adjustment condition. According to instructions from the CPU, time adjusting sections 1720 can set the drive performance of each selected switch to realize a total drive performance with 128 steps, by designating whether each switch is selected according to the 7-bit digital value.

The following describes a process of the later part of this adjustment flow, i.e. S1740. This part is an example of a timing adjustment step for adjusting the output timing of the switching signals output by the irradiation control section 170. According to instructions from the CPU 130, the timing adjusting section 1710 included in the irradiation control section 170 adjusts the timing at which the blanking voltages are applied to the blanking electrodes, by adjusting the timings of the switching signals.

Next, the CPU 130 makes a judgment concerning whether adjustment has been completed for all of the electron beams in the array beam (S1750). If all adjustments are not yet completed (S1750: No), the electron beam that is the adjustment target is changed (S1700) and the adjustments from S1710 to S1740 are repeated. When adjustment has been completed for all of the electron beams in the array beam (S1750: Yes), the CPU 130 ends the entire adjustment flow.

Figure 18:
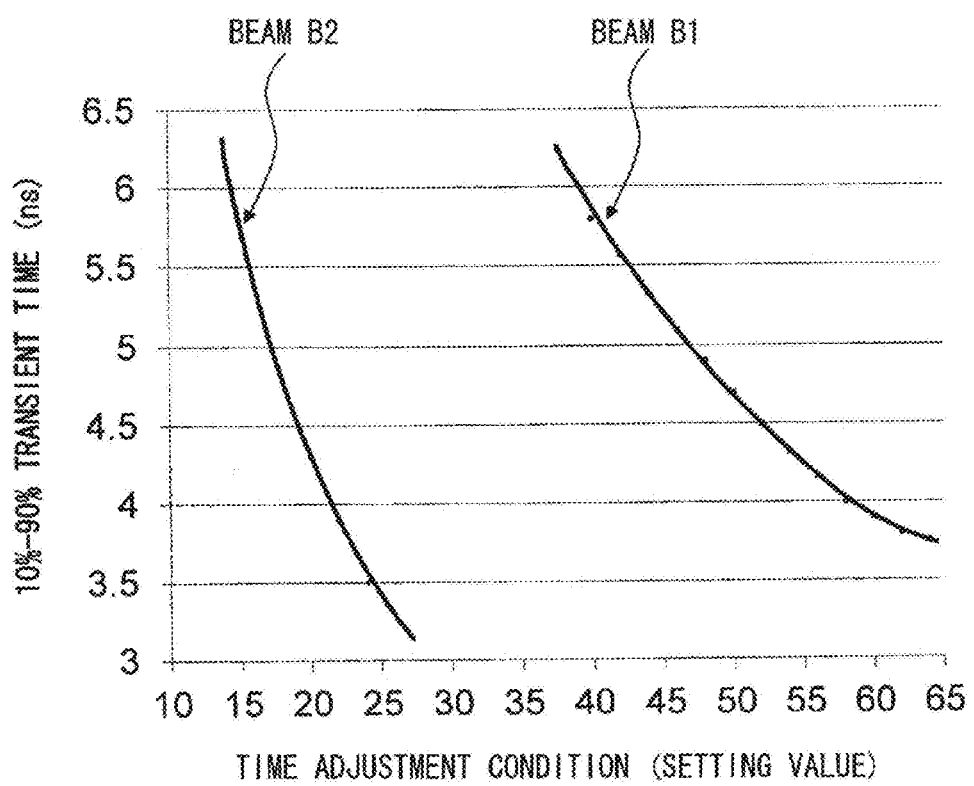
FIG. 18 shows an exemplary relationship between the time adjustment conditions of time adjusting sections 1720 and the transient times of blanking voltages corresponding to the electron beam B1 and the electron beam B2.

FIG. 18 shows the relationship between the time adjustment conditions of time adjusting sections 1720 and the transient times of blanking voltages for the drive circuits 172 corresponding to the electron beam B1 and the electron beam B2, as an example relating to the adjustment of the transient time of the blanking voltage in S1710 to S1730 shown in FIG. 17. Each time adjusting section 1720 selects switch circuits for outputting the blanking voltage according to a 7-bit digital value (0 to 127) indicating the time adjustment condition, which is shown on the horizontal axis in this drawing. The vertical axis of this drawing indicates a 10%-90% transient time. Here, the 10%-90% transient time indicates the time needed for the blanking voltage to change from 10% of its change amplitude to 90% of its change amplitude. The 10%-90% transient time is an index that indicates the rate of change of the blanking voltage. The 10%-90% transient time is determined based on the transient waveform of the blanking voltage measured by the measuring section 1100, for example. When the change amplitude of the blanking voltage is 5 V, for example, the 10%-90% transient time indicates the time needed for the blanking voltage to rise from 0.5 V to 4.5 V. The 10%-90% transient time is usually substantially the same as the time needed for the blanking voltage to fall from 4.5 V to 0.5 V.

For the electron beam B1, by setting the time adjustment condition of the time adjusting section 1720 in a range from 40 to 65, the 10%-90% transient time of the blanking voltage can be set in a range from approximately 6 ns to approximately 3.5 ns. For the electron beam B2, by setting the time adjustment condition of the time adjusting section 1720 in a range from 14 to 24, the 10%-90% transient time of the blanking voltage can be set in a range from approximately 6 ns to approximately 3.5 ns. The reason that different time adjustment conditions of the time adjusting sections 1720 are set for the electron beam B1 and the electron beam B2 to realize the same 10%-90% transient time of 5.0 ns, for example, is that the loads of the blanking electrodes driven by the drive circuits 172 are different between the electron beams B1 and B2.

In this case as well, if the time adjustment conditions of the time adjusting sections 1720 are suitably acquired, it is possible to substantially match the transient times of the electron beams B1 and B2. As an example, if the time adjustment condition of the time adjusting section 1720 of the drive circuit 172 for the electron beam B1 is set to 47, the 10%-90% transient time of the blanking voltage of the electron beam B1 becomes approximately 5.0 ns. Furthermore, if the time adjustment condition of the time adjusting section 1720 of the drive circuit 172 for the electron beam B2 is set to 17, the 10%-90% transient time of the blanking voltage of the electron beam B2 becomes approximately 5.0 ns. When the 10%-90% transient times of blanking voltages substantially match, the transient waveforms of the blanking voltages for the switching of the beam state also substantially match. In other words, these blanking voltages have substantially matching falling times and rising times for the switching of the beam state.

As described above, according to instructions of the CPU, even when the drive circuits 172 are driving different loads, the measuring section 1100 and the time adjusting sections 1720 can adjust the transient times of the blanking voltages to be a prescribed value, e.g. 5 ns, by suitably setting the time adjustment conditions of the time adjusting sections 1720.

Figure 19:
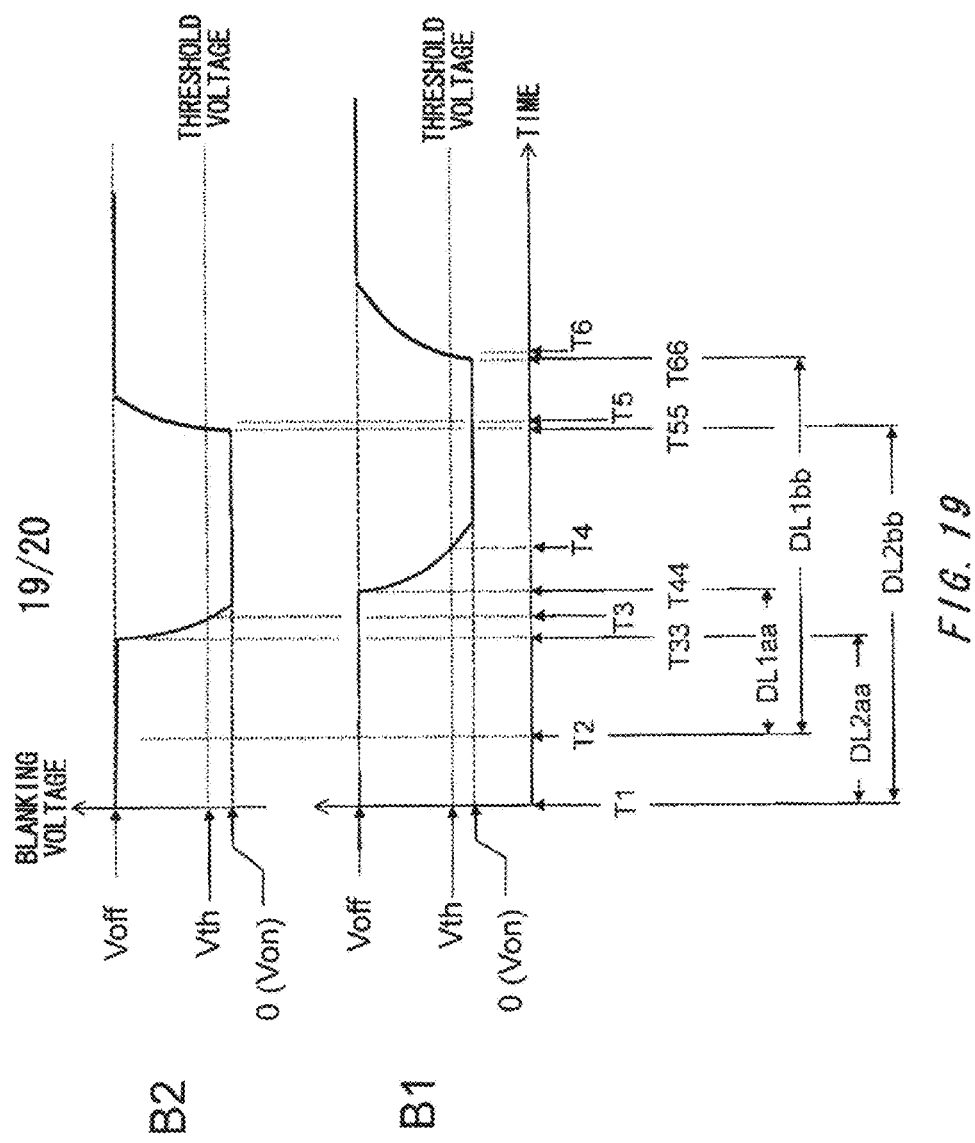
FIG. 19 shows exemplary blanking voltages used for adjustment by the timing adjusting section 1710 according to the present embodiment.

FIG. 19 is a drawing for describing the operation of the timing adjusting section 1710 in relation to the adjustment of the timings of the switching signals in S1740 shown in FIG. 17. This drawing shows exemplary blanking voltages supplied to the blanking electrodes 64 for the electron beams B1 and B2. The blanking voltages Voff, Vth, and 0 V on the vertical axis in this drawing correspond respectively to the voltage values described in FIG. 13. Furthermore, the timings T1, T2, T3, T4, T5, and T6 on the horizontal axis in this drawing correspond respectively to the timings described in FIGS. 7 and 13.

This drawing shows an example in which the measuring section 1100 references the measured falling times and rising times of the blanking voltages and uses the timing adjusting section 1710 to adjust the output timings of the switching signals for the electron beams.

When the electron beam B1 is switched from the OFF state to the ON state, the irradiation control section 170 outputs the switching signal at a timing T44 that is a time DL1*aa* after the timing T2 at which the irradiation position of the electron beam B1 passed through the exposure reference position. Here, the time DL1*aa* is the elapsed time obtained by subtracting the falling time of the blanking voltage of the electron beam B1 from the elapsed time DL1*a* calculated by the elapsed time calculating circuit 166. This falling time of the blanking voltage is the delay amount from when the switching signal of the irradiation control section 170 for the electron beam B1 changes to when the blanking voltage reaches the threshold voltage, as detected during the measurement step. Accordingly, this falling time includes the delay time of the blanking voltage signal caused by all circuits and wires from the irradiation control section 170 to the blanking electrode. According to instructions of the CPU 130, the timing adjusting section 1710 performs an adjustment to subtract the falling time of the blanking voltage of the electron beam B1 from the elapsed time DL1*a*. In this way, as shown in the drawing, the blanking voltage of the electron beam B1 becomes the threshold voltage Vth at the timing T4 that is the time DL1*a* later than the timing at which reference position was passed, and switches to a beam irradiation state at the timing T4. The exposure apparatus 100 can begin radiating the electron beam B1 after the passage of the time DL1*a* (see Expressions 1 and 2), which is determined from the reference position of the exposure, the size and position of the design pattern, and the stage speed.

When the electron beam B1 is switched from the ON state to the OFF state, the irradiation control section 170 outputs the switching signal at a timing T66 that is a time DL1*bb* after the timing T2 at which the irradiation position of the electron beam B1 passed through the exposure reference position. Here, the time DL1*bb* is the elapsed time obtained by subtracting the rising time of the blanking voltage of the electron beam B1 from the elapsed time DL1*b* calculated by the elapsed time calculating circuit 166. This rising time of the blanking voltage is the delay amount from when the switching signal of the irradiation control section 170 for the electron beam B1 changes to when the blanking voltage reaches the threshold voltage, as detected during the measurement step. According to instructions of the CPU 130, the timing adjusting section 1710 performs an adjustment to subtract the rising time of the blanking voltage of the electron beam B1 from the elapsed time DL1*b*. In this way, as shown in the drawing, the blanking voltage of the electron beam B1 becomes the threshold voltage Vth at the timing T6 that is the time DL1*b* later than the timing at which reference position was passed, and switches to a state of not radiating the beam at the timing T6. The exposure apparatus 100 can stop radiating the electron beam B1 after the passage of the time DL1*b* (see Expressions 1 and 2), which is determined from the reference position of the exposure, the size and position of the design pattern, and the stage speed.

In the same manner, when the electron beam B2 is switched from the OFF state to the ON state, the irradiation control section 170 outputs the switching signal at a timing T33 that is a time DL2*aa* after the timing T1 at which the irradiation position of the electron beam B2 passed through the exposure reference position. Here, the time DL2*aa* is the elapsed time obtained by subtracting the falling time of the blanking voltage of the electron beam B2 from the elapsed time DL2*a* calculated by the elapsed time calculating circuit 166. This falling time of the blanking voltage is the delay amount from when the switching signal of the irradiation control section 170 for the electron beam B2 changes to when the blanking voltage reaches the threshold voltage, as detected during the measurement step. According to instructions of the CPU 130, the timing adjusting section 1710 performs an adjustment to subtract the falling time of the blanking voltage of the electron beam B2 from the elapsed time DL2*a*. In this way, as shown in the drawing, the blanking voltage of the electron beam B2 becomes the threshold voltage Vth at the timing T3 that is the time DL2*a* later than the timing at which reference position was passed, and switches to a beam irradiation state at the timing T3. The exposure apparatus 100 can begin radiating the electron beam B2 after the passage of the time DL2*a* (see Expressions 1 and 2), which is determined from the reference position of the exposure, the size and position of the design pattern, and the stage speed.

When the electron beam B2 is switched from the ON state to the OFF state, the irradiation control section 170 outputs the switching signal at a timing T55 that is a time DL2*bb* after the timing T1 at which the irradiation position of the electron beam B2 passed through the exposure reference position. Here, the time DL2*bb* is the elapsed time obtained by subtracting the rising time of the blanking voltage of the electron beam B2 from the elapsed time DL2*b* calculated by the elapsed time calculating circuit 166. This rising time of the blanking voltage is the delay amount from when the switching signal of the irradiation control section 170 for the electron beam B2 changes to when the blanking voltage reaches the threshold voltage, as detected during the measurement step. According to instructions of the CPU 130, the timing adjusting section 1710 performs an adjustment to subtract the rising time of the blanking voltage of the electron beam B2 from the elapsed time DL2*b*. In this way, as shown in the drawing, the blanking voltage of the electron beam B2 becomes the threshold voltage Vth at the timing T5 that is the time DL2*b* later than the timing at which reference position was passed, and switches to a state of not radiating the beam at the timing T5. The exposure apparatus 100 can stop radiating the electron beam B2 after the passage of the time DL2*b* (see Expressions 1 and 2), which is determined from the reference position of the exposure, the size and position of the design pattern, and the stage speed.

According to instructions of the CPU, the timing adjusting section 1710 receives the falling time and the rising time as elapsed time correction amounts for each blanking electrode 64, and may individually adjust the output timing of the switching signals output by the irradiation control section 170. In this way, even when there are variations among the falling times and the rising times for each blanking electrode 64, the exposure apparatus 100 can radiate the electron beams with the width intended by the design at the target position on the sample.

In the above description, the exposure apparatus 100 may adjust the time adjustment conditions of the time adjusting sections 1720 in a manner to realize the same transient time for the drive circuits 172 corresponding to all of the electron beams in the array beam. At this time, the blanking voltages of all of the electron beams in the array beam have substantially the same falling time. Furthermore, the blanking voltages of all of the electron beams in the array beam have substantially the same rising time. In this way, after the entire adjustment flow shown in FIG. 17 has been performed, the timing adjusting section 1710 should have one timing adjustment value for the elapsed time in a case where the electron beams are switched from the OFF state to the ON state and one timing adjustment value for the elapsed time in a case where the electron beams are switched from the ON state to the OFF state, and these two adjustment values are used for all of the electron beams in the array beam. The exposure apparatus 100 can eliminate the effort of determining the adjustment values of the timing adjusting section 1710, and can conserve storage space that would be used for the adjustment values of the timing adjusting section 1710.

Figure 20:
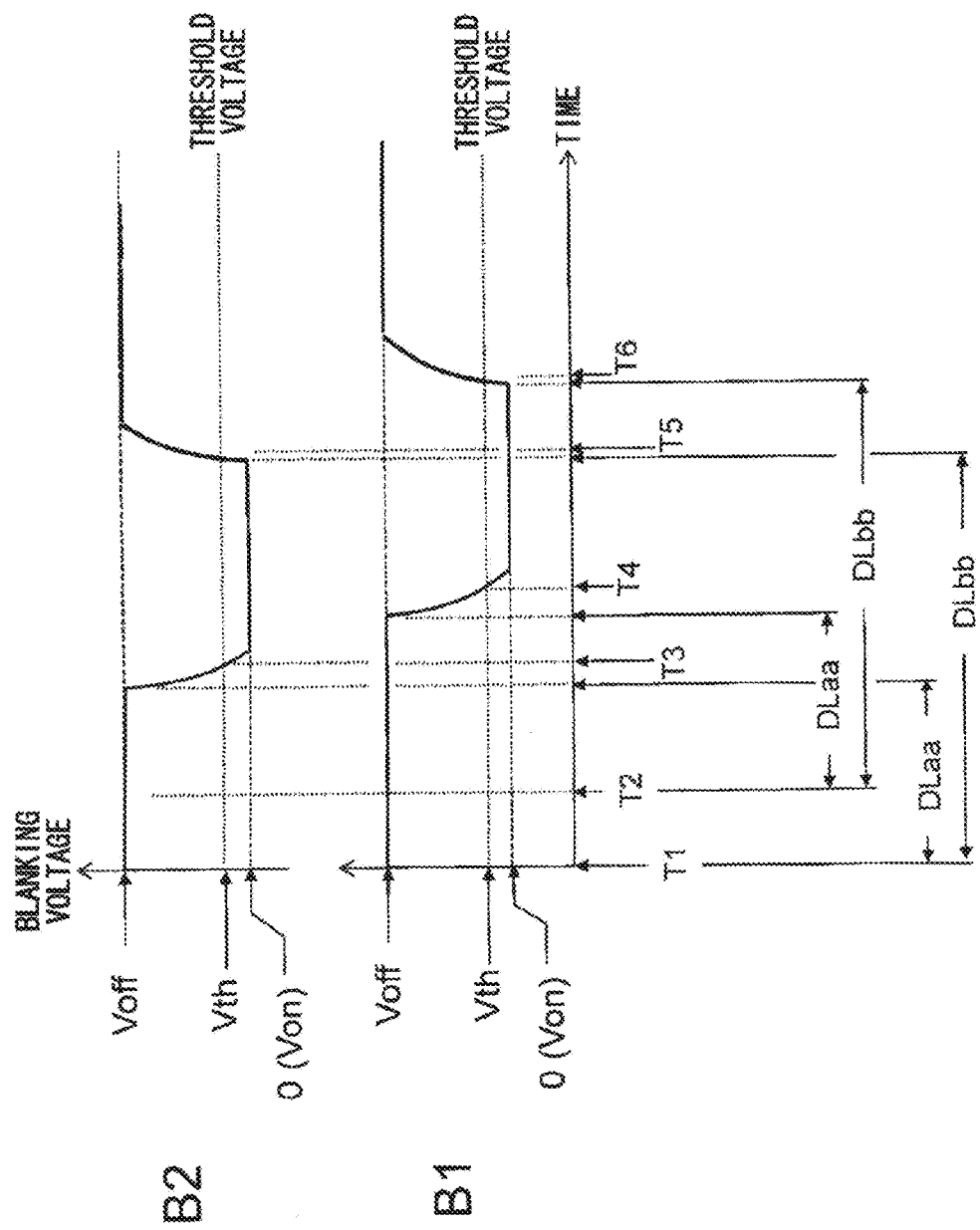
FIG. 20 shows exemplary blanking voltages used for the adjustment by the timing adjusting section 1710 and the time adjusting sections 1720 according to the present embodiment.

FIG. 20 shows an exemplary change over time of the blanking voltages supplied to the blanking electrodes 64 of the electron beams B1 and B2 after the entire adjustment flow shown in FIG. 17 has been applied. The vertical axis and horizontal axis in this drawing respectively indicate the same content as the vertical axis and the horizontal axis in FIGS. 13 and 19. The voltage values shown by the arrows on the vertical axis in this drawing and the timings T1, T2, T3, T4, T5, and T6 shown by the arrows on the horizontal axis in this drawing respectively indicate the same content as the voltage values and timings shown by the same reference numerals in FIGS. 13 and 19.

After the entire adjustment flow has been applied, for the electron beam B1 and the electron beam B2, the same adjustment value for the switching signal output timing is applied by the timing adjusting section 1710 on the falling side of the blanking voltages. In other words, if the switching signals are output at a timing that is the same elapsed time, e.g. the time DLaa, later than the timings T2 and T1 at which the irradiation positions of the electron beam B1 and the electron beam B2 respectively passed through the exposure reference position, the electron beam B1 and the electron beam B2 respectively reach the threshold voltage at the timings T4 and T3 to begin beam irradiation.

Furthermore, for the electron beam B1 and the electron beam B2, the same adjustment value for the switching signal output timing is applied by the timing adjusting section 1710 on the rising side of the blanking voltages. In other words, if the switching signals are output at a timing that is the same elapsed time, e.g. the time DLbb, later than the timings T2 and T1 at which the irradiation positions of the electron beam B1 and the electron beam B2 respectively passed through the exposure reference position, the electron beam B1 and the electron beam B2 respectively reach the threshold voltage at the timings T6 and T5 to stop beam irradiation.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, the adjustment flow shown in FIG. 17 may be performed while the exposure apparatus 100 outputs the electron beams but actually blanks the electron beams, or may be performed in a state where the electron beams are not being output. In the latter case, the exposure apparatus 100 can output the electron beams in a state where the adjustment of the output timings of the switching signals and the transient times of the blanking voltage has been completed for each of the blanking electrodes 64.

The exposure apparatus 100 may perform the adjustment flow shown in FIG. 17 before starting the exposure operation shown in the operational flow of FIG. 3. In this way, the exposure apparatus 100 can start the exposure operation in a state where the output timings of the switching signals and the transient times of the blanking voltages have been adjusted for all of the electron beams in the array beam.

Furthermore, when the entire exposure operation shown in the operational flow of FIG. 3 (from the start to end shown in FIG. 3) is repeatedly used, the exposure apparatus 100 may perform the adjustment flow shown in FIG. 17 after the entire exposure operation shown in FIG. 3 has been performed a predetermined number of times or performed for a predetermined time period, and before the next exposure operation is begun. In this way, the exposure apparatus 100 can periodically adjust the output timings of the switching signals and the transient times of the blanking voltages for all of the electron beams in the array beam.

By detecting the change over time of the adjustment conditions of each time adjusting section 1720 and the timing adjusting section 1710 being periodically adjusted, the exposure apparatus 100 may periodically monitor the state of the blanking electrodes 64 mounted on the column section 120. Monitoring information relating to the change over time of the adjustment conditions may be used as information for observing the operational status of the exposure apparatus 100. In other words, when there are no significant changes in the output timings of the switching signals or the transient times of the blanking voltages, the exposure apparatus 100 or a manager may judge that there are no significant changes occurring in the operational status of the blanking section 60 including the blanking electrodes 64. On the other hand, when there is at least a certain amount of change in the output timings of the switching signals or the transient times of the blanking voltages, the exposure apparatus 100 or the manager may consider that some change has occurred in the blanking section 60 including the blanking electrodes 64, temporarily stop the exposure, and investigate the apparatus. In this way, the exposure apparatus 100 or the manager may use the monitoring information to guarantee the operational reliability of the exposure apparatus 100. Furthermore, in each step of the processes described above, instead of having the CPU 130 output instructions for the process, the exposure apparatus 100 may be configured to have another component such as the measuring section 1100 output instructions for the process.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An exposure apparatus that exposes a pattern on a sample, the exposure apparatus comprising:
   a plurality of blanking electrodes that are provided corresponding to a plurality of charged particle beams and each switch whether the corresponding particle beam irradiates the sample according to an input voltage;
   an irradiation control section that outputs switching signals for switching blanking voltages supplied respectively to the blanking electrodes; and
   a measuring section that, for each blanking electrode, measures a delay amount that is from when the switching signal changes to when the blanking voltage changes, wherein the measuring section includes:
   a reference voltage generating section that generates a sequentially changing reference voltage; and
   a delay amount detecting section that, for each blanking electrode, detects a plurality of delay amounts from when the switching signal changes to when the blanking voltage reaches each of the sequentially changed reference voltages.

2. The exposure apparatus according to claim 1, wherein the irradiation control section includes a timing adjusting section that individually adjusts an output timing of the switch signal for each blanking electrode.

3. The exposure apparatus according to claim 2, wherein the timing adjusting section, for each blanking electrode, individually adjusts the output timing of the switch signal such that the blanking voltage reaches a predetermined threshold voltage at a predetermined timing.

4. The exposure apparatus according to claim 1, comprising:
   a plurality of drive circuits that are provided corresponding to the blanking electrodes and each output a blanking voltage corresponding to the switching signal to the corresponding blanking electrode.

5. The exposure apparatus according to claim 4, wherein each drive circuit includes a time adjusting section that individually adjusts a transient time of the blanking voltage output by the corresponding drive circuit.

6. A method using an exposure apparatus that exposes a pattern on a sample, the method comprising:
   irradiation control of outputting switching signals for switching blanking voltages supplied respectively to a plurality of blanking electrodes that are provided corresponding to a plurality of charged particle beams and each switch whether the corresponding particle beam irradiates the sample according to an input voltage; and
   measurement of, for each blanking electrode, measuring a delay amount that is from when the switching signal changes to when the blanking voltage changes, wherein the measurement includes:
   generating a sequentially changing reference voltage; and
   detecting a plurality of delay amounts from when the switching signal changes to when the blanking voltage reaches each of the sequentially changed reference voltages.

7. The method according to claim 6, further comprising adjustment of, for each blanking electrode, adjusting the time needed for the blanking voltage to reach a predetermined threshold voltage.

8. The method according to claim 7, wherein
the adjustment includes, for each blanking electrode, individually adjusting an output timing of the switch signal.

9. The method according to claim 7, wherein
the exposure apparatus comprises a plurality of drive circuits that are provided corresponding to the blanking electrodes and each output a blanking voltage corresponding to the switching signal to the corresponding blanking electrode, and
the adjustment includes time adjustment of, for each blanking electrode, individually adjusting a transient time of the blanking voltage output by the corresponding drive circuit.

* * * * *